United States Patent
Asai et al.

(10) Patent No.: US 8,729,148 B2
(45) Date of Patent: May 20, 2014

(54) PHOTOCURABLE DRY FILM, METHOD FOR PREPARING SAME, PATTERNING METHOD AND FILM FOR PROTECTING ELECTRIC AND ELECTRONIC PARTS

(75) Inventors: Satoshi Asai, Annaka (JP); Takanobu Takeda, Annaka (JP); Hideto Kato, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 529 days.

(21) Appl. No.: 12/967,163

(22) Filed: Dec. 14, 2010

(65) Prior Publication Data
US 2011/0143092 A1     Jun. 16, 2011

(51) Int. Cl.
| | |
|---|---|
| *C08J 3/28* | (2006.01) |
| *C08F 2/50* | (2006.01) |
| *G03F 7/00* | (2006.01) |
| *G03F 7/004* | (2006.01) |
| *G03C 1/73* | (2006.01) |
| *C09D 183/14* | (2006.01) |
| *H01L 23/29* | (2006.01) |

(52) U.S. Cl.
CPC .............. *C08L 83/09* (2013.01); *C09D 183/14* (2013.01); *H01L 23/293* (2013.01)
USPC ........... 522/148; 522/172; 522/134; 522/146; 430/270.1; 430/280.1; 430/339; 430/269; 430/325; 428/446; 428/447

(58) Field of Classification Search
USPC ............... 522/148, 172, 134, 146; 430/270.1, 430/280.1, 339, 269, 325; 428/446, 447
See application file for complete search history.

(56) References Cited

U.S. PATENT DOCUMENTS

| | | | |
|---|---|---|---|
| 3,159,601 A | 12/1964 | Ashby | |
| 3,159,662 A | 12/1964 | Ashby | |
| 3,220,972 A | 11/1965 | Lamoreaux | |
| 3,775,452 A | 11/1973 | Karstedt | |
| 7,700,403 B2 | 4/2010 | Arai et al. | |
| 7,785,766 B2 * | 8/2010 | Kato et al. | 430/270.1 |
| 2011/0275768 A1 * | 11/2011 | Yasuda et al. | 525/474 |
| 2012/0108762 A1 * | 5/2012 | Kondo et al. | 525/476 |
| 2012/0235284 A1 * | 9/2012 | Sugo et al. | 257/620 |

FOREIGN PATENT DOCUMENTS

| | | | |
|---|---|---|---|
| EP | 1 953 183 A1 | | 8/2008 |
| JP | 2003048989 A | * | 2/2003 |
| JP | 2008-184571 A | | 8/2008 |
| JP | 2009-200315 A | | 9/2009 |

OTHER PUBLICATIONS

European Search Report issued Jul. 15, 2011, in European Patent Application No. 10252117.6.

* cited by examiner

*Primary Examiner* — Sanza McClendon
(74) *Attorney, Agent, or Firm* — Birch, Stewart, Kolasch & Birch, LLP

(57) ABSTRACT

Disclosed herein is a photocurable dry film including a structure having a photocurable resin layer sandwiched between a support film and a protective film, the photocurable resin layer being formed of a photocurable resin composition including ingredients (A) to (D):

(A) a silicone skeleton-containing polymer compound having the repeating units represented by the following general formula (1)

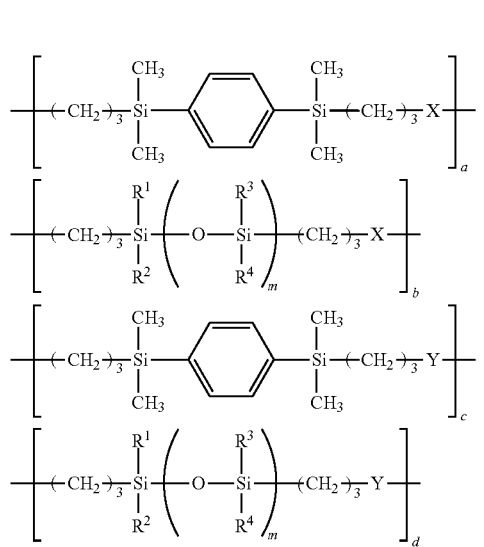

(1)

(2)

wherein X and Y, respectively, a divalent organic group represented by the following general formula (2) or (3)

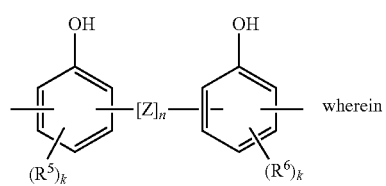

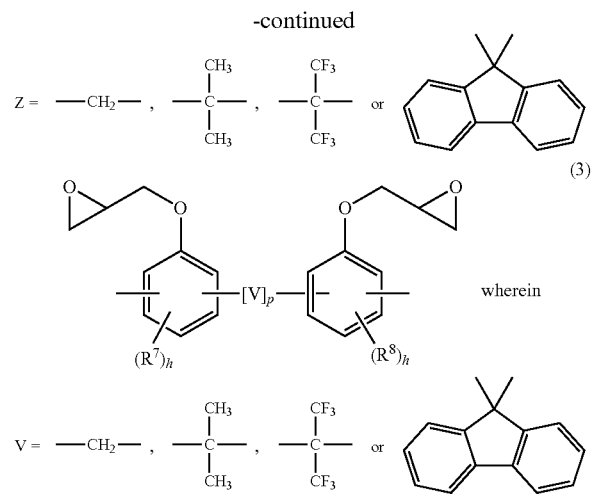

(3)

wherein (B) a crosslinking agent selected from formalin-modified or formalin-alcohol-modified amino condensates and phenolic compound having on average two or more methylol groups or alkoxymethylol groups in one molecule;

(C) a photoacid generator capable of generating an acid by decomposition with light having a wavelength of 190 to 500 nm; and (D) a solvent.

17 Claims, 1 Drawing Sheet

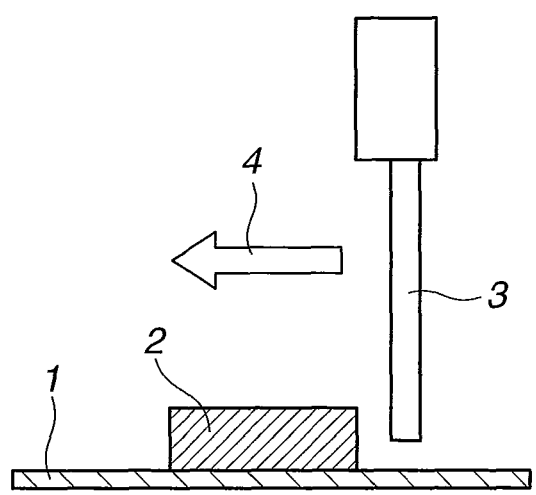

PHOTOCURABLE DRY FILM, METHOD FOR PREPARING SAME, PATTERNING METHOD AND FILM FOR PROTECTING ELECTRIC AND ELECTRONIC PARTS

CROSS-REFERENCE TO RELATED APPLICATION

This non-provisional application claims priority under 35 U.S.C. §119(a) on Patent Application No. 2009-283670 filed in Japan on Dec. 15, 2009, the entire contents of which are hereby incorporated by reference.

TECHNICAL FIELD

This invention relates to a photocurable dry film and a method for preparing the film, and also to a method for forming a pattern by bringing a photocurable resin layer in intimate contact with a substrate, particularly a substrate having surface irregularities by using the photocurable dry film and a film for protecting wirings, circuits, substrates and the like by using a cured film obtained from the above-mentioned photocurable resin layer. In view of its heat resistance, chemical resistance, insulating property and flexibility, the protecting film is particularly effective for applications as an insulating film for semiconductor devices including those for re-wiring purposes, an insulating film for multilayered printed boards, a solder mask, a cover-lay film and an embedding insulating film for silicon-through via (TSV) interconnection, and also for substrate bonding.

BACKGROUND ART

In accordance with the miniaturization and high performance designing of a variety of electronic devices including personal computers, digital cameras, cell phones and the like, there is rapidly increasing a demand for further miniaturization, thinning and high densification of semiconductor devices. Hence, in high-density mounting technologies that are able to cope with an increasing substrate area in productivity growth and cover chip-size packages or chip-scale packages (CSP) or three-dimensional laminates, there have been demanded developments of photosensitive insulating materials of the type adapted for application to structures that have fine irregularities of high aspect ratio on a substrate.

For such a photosensitive insulating material as set out above, there has been proposed a photocurable resin composition (Patent Document 1: JP-A 2008-184571), which is applicable over a wide range of film thickness according to a spin coating technique ordinarily employed in a semiconductor device manufacturing procedure, is able to form a micropattern within a wide wavelength region and is able to provide a film for protecting electric and electronic parts by low-temperature after-curing as having excellent flexibility, heat resistance, electric characteristics, adhesion, reliability and chemical resistance. However, if this photocurable resin composition is coated onto a substrate having surface irregularities by the spin coating technique, a difficulty is involved in coating the substrate therewith substantially in a uniform way. More particularly, the photocurable resin composition is apt to establish spaces at stepped portions on the substrate and thus, further improvements in flatness and step coverage have been expected. For other coating techniques used in place of the spin coating technique, a spray method has been proposed (Patent Document 2: JP-A 2009-200315). However, such a method is liable to cause, in principle, defects such as a difference in height owing to the irregularities of the substrate, or no film formation at a pattern edge and pinholes at a bottom recess. Hence, the problems on the flatness and step coverage have not been solved satisfactorily yet.

SUMMARY OF INVENTION

Under these circumstances in the art, it is an object of the invention to provide a photocurable dry film, which includes a photocurable resin layer showing a specified viscosity coefficient found by us and also a method for preparing the film. It is another object of the invention to provide a method for forming a micropattern in a wide wavelength region wherein the above-mentioned photocurable dry film is used to form, on a substrate having surface irregularities, a micropattern in the photocurable resin layer over a wide range of layer thickness. It is a further object of the invention to provide a film for protecting electric and electronic parts, such as wirings, circuits and substrates, wherein the film is made up of a cured film obtained by after-curing, at low temperature, the pattern obtained by the above patterning method.

In order to achieve the above objects, we have made intensive studies and, as a result, found that a cured film, which is obtained by a patterning method using a photocurable dry film that has a structure including a 10 to 100 μm thick photocurable resin layer whose viscosity coefficient at a temperature of 80 to 120° C. is at 10 to 5,000 Pa·s, is excellent for use as a protective film for electric and electronic parts.

Accordingly, the invention provides a photocurable dry film and a method for preparing the film, a patterning method and a film for protecting electric and electronic parts set forth below.

[1] A photocurable dry film including a structure having a 10 to 100 μm thick photocurable resin layer sandwiched between a support film and a protective film wherein the photocurable resin layer has a viscosity coefficient of 10 to 5,000 Pa·s at a temperature of 80 to 120° C., the photocurable resin layer being made of a photocurable resin composition comprising the following ingredients (A) to (D):

(A) a silicone skeleton-containing polymer compound having repeating units represented by the following general formula (1) and a weight average molecular weight of 3,000 to 500,000

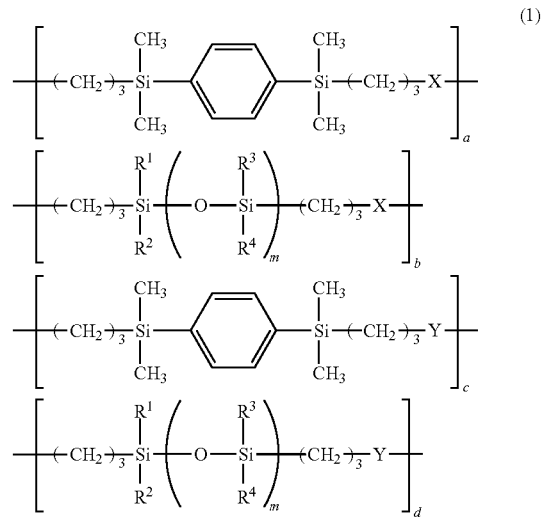

wherein $R^1$ to $R^4$ may be the same or different and represent a monovalent hydrocarbon group having 1 to 8 carbon atoms, m is an integer of 1 to 100, a, b, c and d are, respectively, 0 or a positive number provided that a, b, c and d do not become 0 at the same time and a+b+c+d=1, and X and Y are, respectively, a divalent organic group represented by the following general formula (2) or (3)

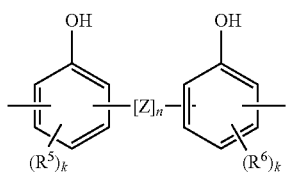
(2)

wherein Z represents a divalent organic group selected from the following groups

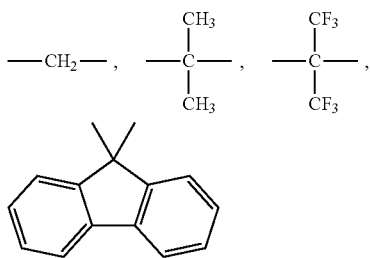

n is 0 or 1, $R^5$ and $R^6$, respectively, represent an alkyl group or alkoxy group having 1 to 4 carbon atoms and may be the same or different, and k is 0, 1 or 2,

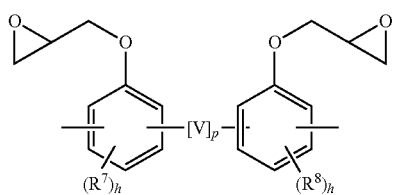
(3)

wherein V represents a divalent organic group selected from the following groups

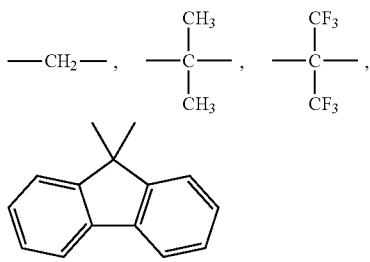

p is 0 or 1, $R^7$ and $R^8$, respectively, represent an alkyl group or alkoxy group having 1 to 4 carbon atoms and may be the same or different, and h is 0, 1 or 2;

(B) at least one crosslinking agent selected from formalin-modified or formalin-alcohol-modified amino condensates and phenolic compounds having, on average, two or more methylol groups or alkoxymethylol groups in one molecule;

(C) a photoacid generator capable of generating an acid by decomposition with light having a wavelength of 190 to 500 nm; and (D) a solvent.

[2] The photocurable dry film as defined in [1], wherein in the formula (1), X is a divalent organic group represented by the general formula (2), and Y is a divalent organic group represented by the general formula (3).

[3] The photocurable dry film as defined in [2], wherein in the formula (1), a=1 or b=1, c=0, and d=0.

[4] The photocurable dry film as recited in [2], wherein in the formula (1), 0.2≤a≤0.8, 0.2≤b≤0.8, c=0, and d=0.

[5] The photocurable dry film as recited in [2], wherein in the formula (1), 0.3≤a≤0.7, 0.2≤b≤0.5, 0<c≤0.2, and 0<d≤0.2.

[6] A laminate including a substrate having a trench and/or a hole with an aperture width of 10 to 100 μm and a depth of 10 to 120 μm and a cured layer of the photocurable resin composition of the photocurable dry film defined in any one of [1] to [5] and laminated on the substrate.

[7] A method for preparing a photocurable dry film defined in any one of [1] to [5], which method including the steps of:

(i) continuously coating, onto a support film, a photocurable resin composition comprising the following ingredients (A) to (D)

(A) a silicone skeleton-containing polymer compound having repeating units represented by the following general formula (1) and a weight average molecular weight of 3,000 to 500,000

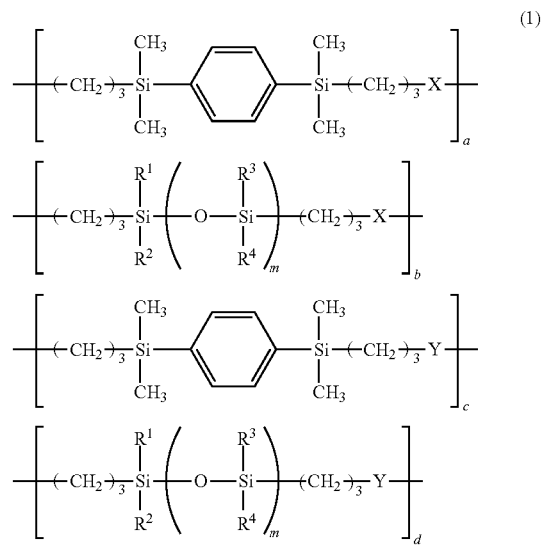
(1)

wherein $R^1$ to $R^4$ may be the same or different and represent a monovalent hydrocarbon group having 1 to 8 carbon atoms, m is an integer of 1 to 100, a, b, c and d are, respectively, 0 or a positive number provided that a, b, c and d do not become 0 at the same time provided that a+b+c+d=1, and X and Y, respectively, represent a divalent organic group represented by the following general formula (2) or (3)

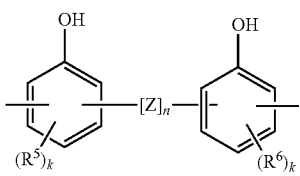

(2)

wherein Z represents a divalent organic group selected from the following groups

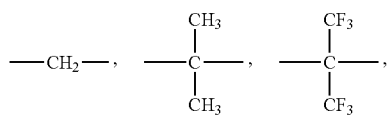

n is 0 or 1, $R^5$ and $R^6$ are, respectively, an alkyl group or alkoxy group having 1 to 4 carbon atoms and may be the same or different, and k is 0, 1 or 2,

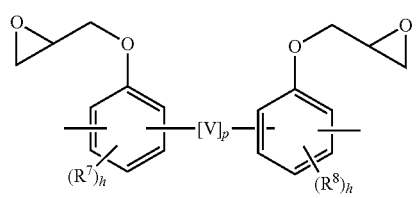

(3)

wherein V represents a divalent organic group selected from the following groups

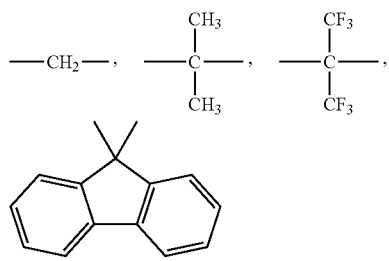

p is 0 or 1, $R^7$ and $R^8$, respectively, represent an alkyl group or alkoxy group having 1 to 4 carbon atoms and may be the same or different, and h is 0, 1 or 2, (B) at least one crosslinking agent selected from formalin-modified or formalin-alcohol-modified amino condensates and phenolic compounds having, on average, two or more methylol groups or alkoxymethylol groups in one molecule, (C) a photoacid generator capable of generating an acid by decomposition with light having a wavelength of 190 to 500 nm, and (D) a solvent;

(ii) continuously drying the photocurable resin composition to form a photocurable resin layer on the support film; and (iii) laminating a protective film on the photocurable resin layer.

[8] A patterning method including the steps of:

(i) separating the protective film from the photocurable dry film recited in any one of [1] to [5] and brining an exposed photocurable resin layer in intimate contact with a substrate;

(ii) exposing the photocurable resin layer to light having a wavelength of 190 to 500 nm via a photomask either through the support film or in a separated state of the support film;

(iii) subjecting to heat treatment after the exposure; and (iv) developing with a liquid developer.

[9] The patterning method as recited in [8], further including the step of (v) after-curing the film patterned by the development at a temperature of 100 to 250° C.

[10] The patterning method as recited in [8] or [9], wherein the substrate has a trench and/or a hole having an aperture width of 10 to 100 μm and a depth of 10 to 120 μm.

[11] A film for protecting electric or electronic parts composed of a cured film obtained by the patterning method recited in [8] or [9].

ADVANTAGEOUS EFFECTS OF INVENTION

According to the invention, when using a photocurable dry film including a photocurable resin layer showing a specified range of viscosity coefficient, micropatterning of the photocurable resin layer having a wide range of thickness on a substrate whose surface is irregular become possible in a wide wavelength region. Moreover, the cured film obtained by after-curing the resulting pattern at low temperatures, which is adapted for use as a film for protecting electric and electronic parts such as wirings, circuits, substrates and the like, exhibits excellent heat resistance, chemical resistance, insulating property and flexibility. Accordingly, the photocurable dry film of the invention is useful as and, in fact, can be favorably employed as a material for providing an insulating layer, an adhesive layer and a film for various protective purposes of electronic parts such as, for example, semiconductor devices including light-emitting and receiving devices, or circuit boards of electric and electronic parts.

BRIEF DESCRIPTION OF DRAWING

FIG. 1 is a schematic view illustrating an adhesion measurement in examples.

DESCRIPTION OF EMBODIMENTS

The photocurable dry film of the invention is now described particularly with respect to its structure.

The photocurable dry film has a structure having a photocurable resin layer sandwiched between a support film and a protective film. The photocurable resin layer is not critical in type so far as there is used a material suited for forming a film for protecting electric and electronic parts. Preferably, photocurable silicone compositions are used because they are capable of micropatterning over a wide range of thickness and in a wide wavelength region and are excellent in flexibility, heat resistance, electric characteristics, adhesion, reliability and chemical resistance when after-cured at low temperatures.

In the practice of the invention, the photocurable dry film is solid. Since no solvent is contained in the photocurable resin layer, there is no concern that bubbles generated by volatilization of a solvent are left in the photocurable resin layer and also in the spaces established with the irregular substrate. With the miniaturization, thinning and multilayering of semiconductor devices, an interlayer insulating film, which is within the scope of application of the invention, tends to be more thinned. Taking the flatness and step coverage on the substrate having irregularities into consideration, an appropriate range of thickness exists. Accordingly, the thickness of the photocurable resin layer is in the range of 10 to 100 μm, preferably 10 to 70 μm and more preferably 10 to 50 μm from the standpoint of the flatness and step coverage.

The photocurable dry film has such a nature that when the film is heated to a level higher than a specified temperature (preferably 200° C. or less, more preferably 150° C. or less), crosslinking reaction occurs in the photocurable resin layer even without light irradiation (which is called dark reaction), resulting in curing of the layer. However, the dark reaction rarely occurs in a specified range of temperature, which we have found, and no bad influence is given to the fluidity of the photocurable resin layer. In addition, the viscosity coefficient and the fluidity of the photocurable resin layer are in close relation with each other, and the photocurable resin layer is able to show an appropriate fluidity within an appropriate range of viscosity coefficient and can be allowed to enter to back of narrow spaces. Accordingly, the viscosity coefficient of the photocurable resin layer is in the range of 10 to 5,000 Pa·s, preferably 30 to 2,000 Pa·s and more preferably 50 to 300 Pa·s, at a temperature of 80 to 120° C. from the standpoint of the fluidity of the layer.

Hence, when the photocurable dry film of the invention is brought in intimate contact with a substrate having surface irregularities, the photocurable resin layer is coated as followed by the irregularities thereby achieving a high degree of flatness. Especially, where a photocurable silicone composition, characterized by low surface tension, is used as a main component of the photocurable resin layer, a higher degree of flatness can be achieved. Moreover, when the photocurable resin layer is brought in intimate contact with the substrate in a vacuum environment, occurrence of the spaces can be more effectively prevented.

Next, the photocurable resin composition used to form the photocurable resin layer of the photocurable dry film according to the invention is described.

Where a photocurable silicone composition is used as the photocurable resin layer, the photocurable resin composition includes (A) a silicone skeleton-containing polymer compound having repeating units represented by the following general formula (1), (B) at least one crosslinking agent selected from formalin-modified or formalin-alcohol-modified amino condensates and phenolic compounds having on average two or more methylol groups or alkoxymethylol groups in one molecule, (C) a photoacid generator capable of decomposition with light having a wavelength of 190 to 500 nm to generate an acid, and (D) a solvent.

As the silicone skeleton-containing polymer compound (A), there can be used a silicone skeleton-containing polymer compound having repeating units represented by the following general formula (1) and having an weight average molecular weight of 3,000 to 500,000

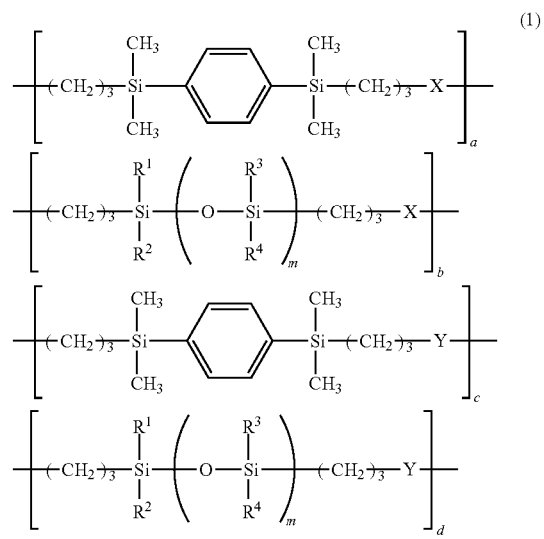

wherein $R^1$ to $R^4$ may be the same or different and represent a monovalent hydrocarbon group having 1 to 8 carbon atoms, preferably 1 to 6 carbon atoms. Specific examples include a linear, branched or cyclic alkyl group such as a methyl group, an ethyl group, a propyl group, an isopropyl group, an n-butyl group, a tert-butyl group, a cyclohexyl group or the like, a linear, branched or cyclic alkenyl group such as a vinyl group, an allyl group, a propenyl group, a butenyl group, a hexenyl group, a cyclohexenyl group or the like, an aryl group such as a phenyl group, a tolyl group or the like, or an aralkyl group such as a benzyl group, a phenylethyl group or the like.

In view of the compatibility with a crosslinking agent and a photoacid generator and photocurability as will be described later, m is an integer of 1 to 100, preferably 1 to 80. In view of adhesion to substrate, electric characteristics and reliability, a, b, c and d are, respectively, 0 or a positive number provided that a, b, c and d do not become 0 at the same time. In this case, $0 \leq a \leq 0.8$ is preferred, $0.2 \leq a \leq 0.8$ is more preferred and $0.3 \leq a \leq 0.7$ is much more preferred, $0 \leq b \leq 1.0$ is preferred, $0.2 \leq b \leq 0.8$ is more preferred and $0.2 \leq b \leq 0.5$ is much more preferred, $0 \leq c \leq 0.3$ is preferred and $0 \leq c \leq 0.2$ is more preferred, and $0 \leq d \leq 0.3$ is preferred and $0 \leq d \leq 0.2$ is more preferred provided that a+b+c+d=1.

a, b, c and d are especially favored to determine in such a way that (i) a=1 or b=1 and c and d are each at 0, (ii) $0.2 \leq a \leq 0.8$, $0.2 \leq b \leq 0.8$ and c and d are each at 0, or (iii) $0.3 \leq a \leq 0.7$, $0.2 \leq b \leq 0.5$, $0 < c \leq 0.2$ and $0 < d \leq 0.2$.

Further, X and Y, respectively, represent a group selected from divalent aromatic groups having a phenolic hydroxyl group or a glycidoxy group represented by the following general formula (2) or (3). Preferably, X is a divalent group represented by the general formula (2) and Y is a divalent group represented by the general formula (3).

The phenolic hydroxyl group is represented by the general formula (2)

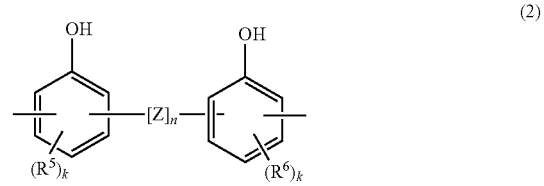

wherein Z represent a divalent organic group selected from the following groups

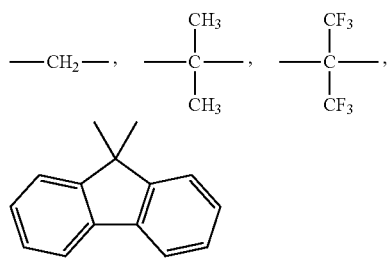

n is 0 or 1, $R^5$ and $R^6$, respectively, represent an alkyl group or alkoxy group having 1 to 4 carbon atoms and may be the same or different, and k is 0, 1 or 2.

Specific examples of $R^5$ and $R^6$ include a methyl group, an ethyl group, an isopropyl group, a tert-butyl group, a methoxy group, an ethoxy group, an isopropyloxy group and the like.

The glycidoxy group is represented by the general formula (3)

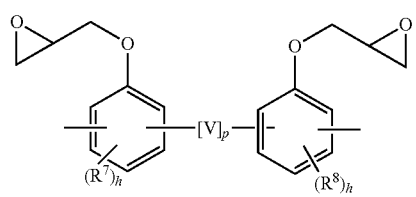

wherein V is a divalent organic group selected from the groups represented the following formulas

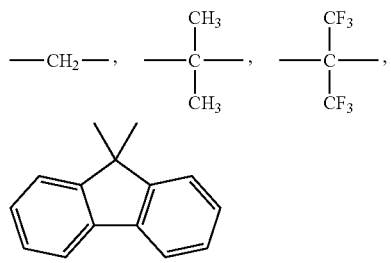

p is 0 or 1, $R^7$ and $R^8$, respectively, represent an alkyl or alkoxy group having 1 to 4 carbon atoms and may be the same or different, and h is 0, 1 or 2.

Specific examples of $R^7$ and $R^8$ may be the same as those mentioned with respect to $R^5$ or $R^6$.

When c is a positive number, X is different from Y. When d is a positive number, X is different from Y.

The weight average molecular weight of the silicone skeleton-containing polymer compound of the invention is at 3,000 to 500,000, preferably at 5,000 to 300,000, in view of the compatibility and photocurability of a photocurable resin composition using same and mechanical characteristics of a cured product obtained from the photocurable resin composition. It will be noted that the weight average molecular weight used herein is a value converted as poly styrene and determined by gel permeation chromatography (GPC).

The silicone skeleton-containing polymer compound of the invention can be prepared according to a so-called "hydrosilylation" polymerization reaction, in the presence of a catalyst, of either a hydrogensilphenylene(1,4-bis(dimethylsilyl)benzene of the following formula (4)

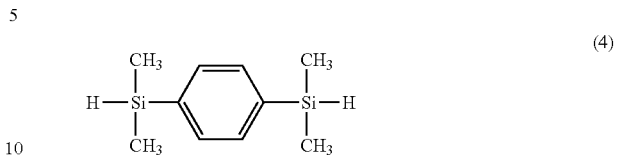

or this hydrogensilphenylene and a dihydroorganosiloxane of the following general formula (5)

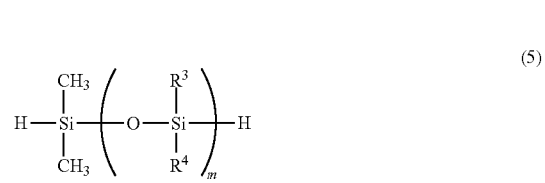

wherein $R^3$, $R^4$ and m, respectively, have the same meanings as defined above, with a specific type of epoxy group-containing compound having a diallyl group and represented by the following general formula (6)

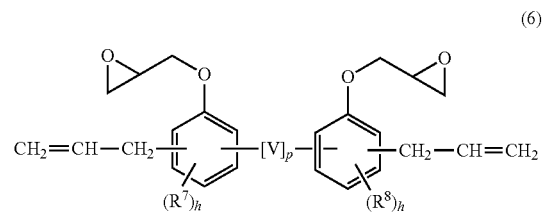

wherein V, $R^7$, $R^8$, p and h, respectively, have the same meanings as defined above, and also with a specific type of phenolic compound having a diallyl compound represented by the following general formula (7)

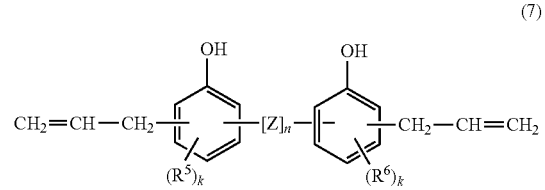

wherein Z, $R^5$, $R^6$, n and k, respectively, have the same meanings as defined before.

It will be noted that the weight average molecular weight of the silicone skeleton-containing polymer compound of the invention can be readily controlled by controlling a ratio between the total number of the allyl groups of the specific type of epoxy group-containing compound having a diallyl group and represented by the formula (6) and the specific type of phenolic compound having a diallyl group and represented by the general formula (7), and the total number of the hydrosilyl groups of the hydrogensilphenylene represented by the formula (4) and the dihydroorganosiloxane represented by the formula (5) (the total number of the allyl groups/the total number of the hydrosilyl groups). Alternatively, the weight average molecular weight may also be readily controlled by using a molecular weight controlling agent including, for example, a monoallyl compound such as o-allylphenol or a monohydrosiloxane such as triethylhydrosilane at the time of polymerization of the specific type of epoxy group-containing compound having a diallyl group and the specific type of phenolic compound having a diallyl group and the hydrogensilphenylene and the dihydroorganosiloxane.

In the above polymerization reaction, the catalyst used includes, for example: a platinum group metal such as platinum (including platinum black), rhodium, palladium or the like; platinum chlorides, chloroplatinic acid and chloroplatinates such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$, $Na_2HPtCl_4 \cdot xH_2O$ wherein x is an integer of 0 to 6, preferably 0 or 6) or the like; alcohol-modified chloroplatinic acid (U.S. Pat. No. 3,220,972); complexes of chloroplatinic acid and olefins (U.S. Pat. Nos. 3,159,601, 3,159,662 and 3,775,452); a platinum group metal, such as platinum black, palladium or the like, supported on a carrier such as alumina, silica, carbon or the like; rhodium-olefin complexes; chlorotris(triphenylphosphine) rhodium (so-called Wilkinson's catalyst); and a complex of platinum chloride, chloroplatinic acid or a chloroplatinate and a vinyl group-containing siloxane (particularly, a vinyl group-containing cyclic siloxane).

The catalyst is used in a catalytic amount and it is preferred that the amount as a platinum group metal is in the range of 0.001 to 0.1 wt % relative to the total amount of materials to be reacted for polymerization.

In the polymerization reaction, a solvent may be used, if necessary. Preferred examples of the solvent include hydrocarbon solvents such as toluene, xylene and the like.

For polymerization conditions, the polymerization temperature is, for example, at 40 to 150° C., preferably at 60 to 120° C. from the standpoint that deactivation of a catalyst does not occur and polymerization may be completed within a short time.

Although depending on the types and amounts of materials to be polymerized, the polymerization time is such that the reaction is completed generally within 0.5 to 100 hours, preferably within 0.5 to 30 hours so as to prevent moisture from entering into a polymerization system. After completion of the polymerization reaction in this way, there can be obtained a silicone skeleton-containing polymer compound of the invention represented by the formula (1) after removal of a solvent by distillation if the solvent is used.

It will be noted that if the weight average molecular weight of the silicone skeleton-containing polymer compound lowers, the viscosity of the polymer compound lowers as well. Therefore, the viscosity coefficient of a photocurable resin layer using the polymer compound lowers as well. When a ratio of molecular units including a linear polysiloxane (b and d in the general formula (1)) increases in the molecule of the silicone skeleton-containing polymer compound, a ratio of molecular units including an aromatic compound such as silphenylene (a and c in the general formula (1)) relatively decreases, so that the viscosity of the resulting polymer compound lowers. This eventually leads to a lowering of the viscosity coefficient of a photocurable resin layer making use of this silicone skeleton-containing polymer compound. Moreover, if the molecular chain length of a linear polysiloxane increases in the molecule of the silicone skeleton-containing polymer compound or if the value of m increases in the general formula (1), the viscosity of the polymer compound lowers. Hence, the viscosity coefficient of a photocurable resin layer using the silicone skeleton-containing polymer compound lowers.

Since the photocurable resin layer of the invention should have a viscosity coefficient of 10 to 5,000 Pa·s, it is preferred to use a silicone skeleton-containing polymer compound obtained by an appropriate combination of the weight average molecular weight, a ratio of the molecular units including a linear polysiloxane and the molecular chain length of the linear polysiloxane in order to obtain a desired nature of the photocurable resin layer.

As the crosslinking agent (B), there can be used one or more compounds selected from formalin-modified or formalin-alcohol-modified amino condensates and phenolic compounds having, on average, two or more methylol groups or alkoxymethylol groups in one molecule.

The formalin-modified or formalin-alcohol-modified amino condensates include, for example, formalin or formalin-alcohol-modified melamine condensates and formalin or formalin-alcohol-modified urea condensates.

The formalin or formalin-alcohol-modified melamine condensate is prepared, for example, by methylolizing a melamine monomer with formalin according to a known process or further alkoxylizing with an alcohol, thereby providing a modified melamine represented by the following general formula (8). It will be noted that the alcohol is preferably a lower alcohol, e.g. an alcohol having 1 to 4 carbon atoms.

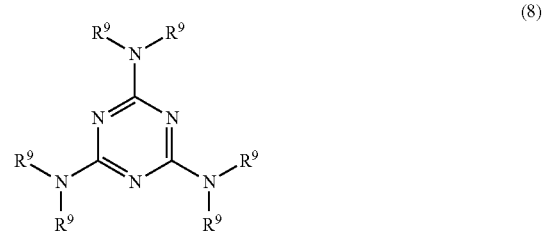

(8)

wherein $R^9$'s may be the same or different and represent a methylol group, an alkoxymethyl group containing an alkoxy group having 1 to 4 carbon atoms, or a hydrogen atom provided that at least one thereof is the methylol group or alkoxymethyl group.

More specifically, $R^9$ represents, for example, a methylol group, an alkoxymethyl group such as a methoxymethyl group, an ethoxymethyl group or the like, or a hydrogen atom.

Specific examples of the modified melamine of the above general formula (8) include trimethoxymethylmonomethylolmelamine, dimethoxymethylmonomethylolmelamine, trimethylolmelamine, hexamethylolmelamine, hexamethoxymethylolmelamine and the like.

Next, the modified melamine of the general formula (8) or multimers thereof (e.g. oligomers such as a dimer, a trimer and the like) are subjected to addition condensation polymerization with formaldehyde to an extent of a desired molecular weight according to an ordinary procedure to obtain a melamine condensate modified with formalin or formalin-alcohol.

The urea condensate modified with formalin or formalin-alcohol is prepared, for example, by a known process wherein a urea condensate of a desired molecular weight is methylolized with formalin, or the methylolized condensate is further alkoxylized with an alcohol.

Specific examples of the urea condensate modified with formalin or formalin-alcohol include a methoxymethylated urea condensate, an ethoxymethylated urea condensate, a propoxymethylated urea condensate and the like.

It will be noted that these modified melamine condensates and modified urea condensates may be used singly or in combination of two or more.

Next, examples of the phenolic compound having on average two or more methylol groups or alkoxymethylol groups in one molecule include (2-hydroxy-5-methyl)-1,3-benzene-dimethanol, 2,2',6,6'-tetramethoxymethyl bisphenol A and the like.

One or more of these phenolic compounds can be used as a crosslinking agent.

The above crosslinking agents may be used singly or in combination of two or more.

The crosslinking agent serves not only as a component that causes a curing reaction with the silicone skeleton-containing polymer compound to permit easy patterning, but also as a component that acts to further increase strength of a cured product. The weight average molecular weight of the crosslinking agent is at 150 to 10,000, preferably at 200 to 3,000 from the standpoint of photocurability and heat resistance.

The amount of the crosslinking agent is in the range of 0.5 to 50 parts by weight, preferably 1 to 30 parts by weight, per 100 parts by weight of the silicone skeleton-containing polymer compound in view of photocurability and reliability as a film for protecting electric and electronic parts after after-curing.

As the photoacid generator (C), there can be used those substances, which are able to generate an acid by irradiation of light having a wavelength of 190 to 500 nm wherein the acid serves as a curing catalyst. Because the photocurable resin composition of the invention exhibits excellent compatibility with photoacid generators, various types of photoacid generators can be used. Examples of the photoacid generator include onium salts, diazomethane derivatives, glyoxime derivatives, β-ketosulfone derivatives, disulfone derivatives, nitrobenzylsulfonate derivatives, sulfonic acid ester derivatives, imidoyl sulfonate derivatives, oxime sulfonate derivatives, iminosulfonate derivatives, triazine derivatives and the like.

Examples of the onium salt include those compounds represented by the following general formula (9)

$$(R^{10})_j M^+ K^- \qquad (9)$$

wherein $R^{10}$ represents a linear, branched or cyclic alkyl group having 1 to 12 carbon atoms, an aryl group having 6 to 12 carbon atoms or an aralkyl group having 7 to 12 carbon atoms, each of which may have a substituent, $M^+$ represents iodonium or sulfonium, $K^-$ represents a non-nucleophilic counter ion, and j is 2 or 3.

In $R^{10}$, the alkyl group includes, for example, a methyl group, an ethyl group, a propyl group, a butyl group, a cyclohexyl group, a 2-oxocyclohexyl group, a norbornyl group, an adamantyl group or the like, and the aryl group includes, for example, a phenyl group, an alkoxyphenyl group such as an o-, m- or p-methoxyphenyl group or ethoxyphenyl group, a m- or p-tert-butoxyphenyl group or the like, or an alkylphenyl group such as a 2-, 3- or -4-methylphenyl group or ethylphenyl group, a 4-tert-butylphenyl group, a 4-butylphenyl group, a dimethylphenyl group or the like. In addition, the aralkyl group includes, for example, a benzyl group, a phenetyl group or the like.

The non-nucleophilic counter ion represented by $K^-$ includes a halide ion such as a chloride ion, a bromide ion or the like, a fluoroalkylsulfonate such as triflate, 1,1,1-trifluoroethanesulfonate, nonafluorobutanesulfonate or the like, an arylsulfonate such as tosylate, benzenesulfonate, 4-fluorobenzenesulfonate, 1,2,3,4,5-pentafluorobenzene-sulfonate or the like, and an alkylsulfonate such as mesylate, bultanesulfonate or the like.

The diazomethane derivatives include the compounds represented by the following general formula (10)

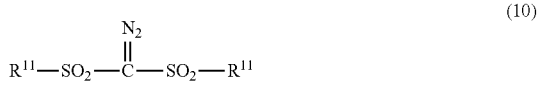

wherein $R^{11}$'s may be the same or different and represent a linear, branched or cyclic alkyl group or halogenated alkyl group having 1 to 12 carbon atoms, an aryl group or halogenated aryl group having 6 to 12 carbon atoms or an aralkyl group having 7 to 12 carbon atoms.

In $R^{11}$, the alkyl group includes, for example, a methyl group, an ethyl group, a propyl group, a butyl group, an amyl group, a cyclopentyl group, a cyclohexyl group, a norbornyl group, an adamantyl group or the like. The halogenated alkyl group includes, for example, a trifluoromethyl group, a 1,1,1-trifluoroethyl group, a 1 1,1-trichloroethyl group, a nonafluorobutyl group or the like. The aryl group includes, for example, a phenyl group, an alkoxyphenyl group such as an o-, m- or p-methoxyphenyl group or ethoxyphenyl group, a m- or p-tert-butoxyphenyl group or the like, or an alkylphenyl group such as 2-, 3- or -4-methylphenyl group or ethylphenyl group, a 4-tert-butylphenyl group, a 4-butylphenyl group, a dimethylphenyl group or the like. The halogenated aryl group includes, for example, a fluorophenyl group, a chlorophenyl group, a 1,2,3,4,5-pentafluorophenyl group or the like. The aralkyl group includes, for example, a benzyl group, a phenetyl group or the like.

More specifically, examples of the photoacid generator include: onium salts such as
diphenyliodonium trifluoromethanesulfonate,
(p-tert-butoxyphenyl)phenyliodonium trifluoromethane-sulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethane-sulfonate,
bis(p-tert-butoxyphenyl)phenylsulfonium trifluoromethane-sulfonate,
tris(p-tert-butoxyphenyl)sulfonium trifluoromethane-sulfonate,
triphenylsulfonium p-toluenesulfonate,
(p-tert-butoxyphenyl)diphenylsulfonium p-toluene-sulfonate,
bis(p-tert-butoxyphenyl)phenylsulfonium p-toluene-sulfonate,
tris(p-tert-butoxyphenyl)sulfonium p-toluenesulfonate,
triphenylsulfonium nonafluorobutanesulfonate,
triphenylsulfonium bultanesulfonate,
trimethylsulfonium trifluoromethanesulfonate,
trimethylsulfonium p-toluenesulfonate,
cyclohexylmethyl(2-oxocyclohexyl)sulfonium trifluoromethane-sulfonate,
cyclohexylmethyl(2-oxocyclohexyl)sulfonium p-toluene-sulfonate,
dimethylphenylsulfonium trifluoromethanesulfonate,
dimethylphenylsulfonium p-toluenesulfonate, dicyclohexylphenylsulfonium trifluoromethanesulfonate,
dicyclohexylphenylsulfonium p-toluenesulfonate,
diphenyl(4-thiophenoxyphenyl)sulfonium hexafluoroantimonate and the like; diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane,
1-tert-amylsulfonyl-1-(tert-butylsulfonyl)diazomethane and the like; glyoxime derivatives such as
bis-o-(p-toluenesulfonyl)-α-dimethylglyoxime,
bis-o-(p-toluenesulfonyl)-α-diphenyl glyoxime,
bis-o-(p-toluenesulfonyl)-α-dicyclohexyl glyoxime,
bis-o-(p-toluenesulfonyl)-2,3-pentandione glyoxime,
bis-o-(p-toluenesulfonyl)-2-methyl-3,4-pentandione glyoxime,
bis-o-(n-butanesulfonyl)-α-dimethylglyoxime,
bis-o-(n-butanesulfonyl)-α-diphenyl glyoxime,
bis-o-(n-butanesulfonyl)-α-dicyclohexyl glyoxime,
bis-o-(n-butanesulfonyl)-2,3-pentandione glyoxime,
bis-o-(n-butanesulfonyl)-2-methyl-3,4-pentandione glyoxime,
bis-o-(methanesulfonyl)-α-dimethyl glyoxime,
bis-o-(trifluoromethanesulfonyl)-α-dimethylglyoxime,
bis-o-(1,1,1-trifluoroethanesulfonyl)-α-dimethylglyoxime,
bis-o-(tert-butanesulfonyl)-α-dimethylglyoxime,
bis-o-(perfluorooctanesulfonyl)-α-dimethylglyoxime,
bis-o-(cyclohexanesulfonyl)-α-dimethylglyoxime,
bis-o-(benzenesulfonyl)-α-dimethylglyoxime,
bis-o-(p-fluorobenzenesulfonyl)-α-dimethylglyoxime,
bis-o-(p-tert-butylbenzenesulfonyl)-α-dimethylglyoxime,
bis-o-(xylenesulfonyl)-α-dimethylglyoxime,
bis-o-(camphorsulfonyl)-α-dimethylglyoxime and the like; oxime sulfonate derivatives such as
α-(benzenesulfoniumoxyimino)-4-methylphenylacetonitrile and the like; β-ketosulfone derivatives such as
2-cyclohexylcarbonyl-2-(p-toluenesulfonyl)propane,
2-isopropylcarbonyl-2-(p-toluenesulfonyl)propane and the like;
disulfone derivatives such as diphenyl disulfone, dicyclohexyl disulfone and the like; nitrobenzyl sulfonate derivatives such as 2,6-dinitrobenzyl p-toluenesulfonate, 2,4-dinitrobenzyl p-toluenesulfonate and the like; sulfonic ester derivatives such as
1,2,3-tris(methanesulfonyloxy)benzene,
1,2,3-tris(trifluoromethanesulfonyloxy)benzene,
1,2,3-tris(p-toluenesulfonyloxy)benzene and the like; imidoyl sulfonate derivatives such as
phthalimidoyl triflate, phthalimidoyl tosylate,
5-norbornene-2,3-dicarboxyimidoyl triflate,
5-norbornene-2,3-dicarboxyimidoyl tosylate,
5-norbornene-2,3-dicarboxyimidoyl-n-butylsulfonate,
n-trifluoromethylsulfonyloxynaphthylimide and the like; and iminosulfonates such as
(5-(4-methylphenyl)sulfonyloxyimino-5H-thiophen-2-ylidene)-(2-methylphenyl)acetonitrile,
(5-(4-(4-methylphenylsulfonyloxy)phenylsulfonyloxyimino)-5H-thiophen-2-ylidene)-(2-methylphenyl)acetonitrile and the like,
2-methyl-2-[(4-methylphenyl)sulfonyl]-1-[(4-methylthio)-phenyl]-1-propane, and the like. Of these, the imidoyl sulfonates, iminosulfonates and oxime sulfonates are preferably used.

The photoacid generators may be used singly or in combination of two or more.

The amount of the photoacid generator is in the range of 0.05 to 20 parts by weight, preferably 0.2 to 5 parts by weight, per 100 parts by weight of the silicone skeleton-containing polymer compound in view of the photocurability in respect of the light absorption and film thickness of the photoacid generator per se.

The solvent (D) may be one that is able to dissolve the silicone skeleton-containing polymer compound, crosslinking agent and photoacid generator.

Examples of the solvent include: ketones such as cyclohexanone, cyclopentanone, methyl-2-n-amylketone and the like; alcohols such as 3-methoxybutanol, 3-methyl-3-methoxybutanol, 1-methoxy-2-propanol, 1-ethoxy-2-propanol and the like; ethers such as propylene glycol monomethyl ether, ethylene glycol monomethyl ether, propylene glycol monoethyl ether, ethylene glycol monoethyl ether, propylene glycol dimethyl ether, diethylene glycol dimethyl ether and the like; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone and the like. These may be used singly or in combination of two or more. Especially, ethyl lactate, cyclohexanone, cyclopentanone, propylene glycol monomethyl ether acetate, γ-butyrolactone or mixed solvents thereof are preferred because of their most excellent solubility of photoacid generator.

The amount of the solvent is in the range of 50 to 2,000 parts by weight, preferably 100 to 1,000 parts by weight per 100 parts by weight of the total of the silicone skeleton-containing polymer compound, the crosslinking agent and photoacid generator in view of the compatibility, viscosity and coating property of a photocurable resin composition.

Further, if necessary, a basic compound may be added as an ingredient (E). For the basic compound, it is convenient to use such a compound that is able to suppress a diffusion speed in case where an acid generated from a photoacid generator is diffused throughout a photocurable resin layer. The formulation of the basic compound enables a resolution to be improved, a sensitivity change after exposure to be suppressed, substrate and environmental dependences to be reduced, and a margin-of-exposure ratio and a pattern shape to be improved.

Examples of the basic compound include primary, secondary and tertiary aliphatic amines, hybrid amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, alcoholic nitrogen-containing compounds, amide derivatives, imide derivatives, and compounds represented by the following general formula (11)

$$N(\alpha)_q(\beta)_{3-q} \qquad (11)$$

wherein q=1, 2 or 3, side chains α's may be the same or different and represent any of substituents represented by the following general formulas (12) to (14), side chains β's may be the same or different and represent a hydrogen atom or a linear, branched or cyclic alkyl group that has 1 to 20 carbon atoms and may have an ether bond or hydroxyl group provided that the side chain α's may join together to form a ring

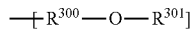  (12)

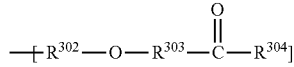  (13)

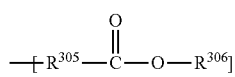  (14)

wherein $R^{300}$, $R^{302}$ and $R^{305}$ independently represent a linear or branched alkylene group having 1 to 4 carbon atoms, $R^{301}$ and $R^{304}$ independently represent a hydrogen atom or a linear, branched or cyclic alkyl group that has 1 to 20 carbon atoms and may contain one or more of a hydroxyl group, an ether bond, an ester bond and a lactone ring, $R^{303}$ represents a single bond or a linear or branched alkylene group having 1 to 4 carbon atoms, $R^{306}$ represents a linear, branched or cyclic alkyl group that has 1 to 20 carbon atoms and may contain one or more of a hydroxyl group, an ether bond, an ester bond and a lactone ring.

Specific examples of the primary aliphatic amine include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine and the like.

Examples of the secondary aliphatic amine include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, N,N-dimethyltetraethylenepentamine and the like.

Examples of the tertiary aliphatic amine include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, N,N,N',N'-tetramethyltetraethylenepentamine and the like.

The hybrid amines include, for example, dimethylethylamine, methylethylpropylamine, benzylamine, phenetylamine, benzyldimethylamine and the like.

Examples of the aromatic amines and heterocyclic amines include aniline derivatives such as aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine and the like, diphenyl(p-tolyl)amine, methyldiphenylamine, triphenylamine, phenylenediamine, naphthylamine, diaminonaphthalene, pyrrole derivatives such as pyrrole, 2H-pyrrole, 1-methylpyrrole, 2,4-dimethylpyrrole, 2,5-dimethylpyrrole, N-methylpyrrole and the like, oxazole derivatives such as oxazole, isooxazole and the like, thiazole derivatives such as thiazole, isothiazole and the like, imidazole derivatives such as imidazole, 4-methylimidazole, 4-methyl-2-phenylimidazole and the like, pyrazole derivatives, furazane derivatives, pyrroline derivatives such as pyrroline, 2-methyl-1-pyrroline and the like, pyrrolidine derivatives such as pyrrolidine, N-methylpyrrolidine, pyrrolidinone, N-methylpyrrolidone and the like, imidazoline derivatives, imidazolidine derivatives, pyridine derivatives such as pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, dimethylaminopyridine and the like, pyridazine derivatives, primidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives such as quinoline, 3-quinolinecarbonitrile and the like, isoquinoline derivatives, cinnoline derivatives, quinazoline derivatives, quinoxaline derivatives, phthalazine derivatives, purine derivatives, puteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, uridine derivatives and the like.

Examples of the carboxyl group-bearing, nitrogen-containing compound include aminobenzoic acid, indolecarboxylic acid, amino acid derivatives such as nicotinic acid, alanine, alginine, aspartic acid, glutamic acid, glycine, histidine, isoleucine, glycyl-leucine, leucine, methionine, phenylalanine, threonine, lysine, 3-aminopyrazine-2-carboxylic acid, methoxyalanine, etc., and the like.

Examples of the sulfonyl group-bearing, nitrogen-containing compound include 3-pyridinesulfonic acid, pyridinium p-toluenesulfonate and the like.

Examples of the hydroxyl group-bearing, nitrogen-containing compound, hydroxyphenyl group-bearing, nitrogen containing compound and alcoholic nitrogen-containing compound include 2-hydroxypyridine, aminocresol, 2,4-quinolinediol, 3-indole methanol hydrate, monoethanolamine, diethanolamine, triethanolamine, N-ethyldiethanolamine, N,N-diethylethanolamine, triisopropanolamine, 2,2'-iminodiethanol, 2-aminoethanol,
3-amino-1-propanol, 4-amino-1-butanol,
4-(2-hydroxyethyl)morpholine, 2-(2-hydroxyethyl)pyridine, 1-(2-hydroxyethyl)piperazine,
1-[2-(2-hydroxyethoxy)ethyl]piperazine, piperidine ethanol, 1-(2-hydroxyethyl)pyrrolidine,
1-(2-hydroxyethyl)-2-pyrrolidinone,
3-piperidino-1,2-propanediol, 3-pyrrolidino-1,2-propanediol,
8-hydroxyjulolidine, 3-quinuclidinol, 3-tropanol,
1-methyl-2-pyrrolidine ethanol, 1-aziridine ethanol,
N-(2-hydroxyethyl)phthalimide,
N-(2-hydroxyethyl)isonicotinamide and the like.

Examples of the amide derivative include formamide, N-methylformamide, N,N-dimethylformamide, acetoamide, N-methylacetoamide, N,N-dimethylacetoamide, propionamide, benzamide and the like.

Examples of the imide derivative include phthalimide, succinimide, maleimide and the like.

Although not limitative, the compounds represented by the general formula (11) include
tris[2-(methoxymethoxy)ethyl]amine,
tris[2-(2-methoxyethoxy)ethyl]amine,
tris[2-(2-methoxyethoxymethoxy)ethyl]amine,
tris[2-(1-methoxyethoxy)ethyl]amine,
tris[2-(1-ethoxyethoxy)ethyl]amine,
tris[2-(1-ethoxypropoxy)ethyl]amine,
tris[2-{2-(2-hydroxyethoxy)ethoxy}ethyl]amine,
4,7,13,16,21,24-hexaoxa-1,10-diazabicyclo[8,8,8]hexacosane,
4,7,13,18-tetraoxa-1,10-diazabicyclo[8,5,5]eicosane,
1,4,10,13-tetraoxa-7,16-diazabicyclooctadecane,
1-aza-12-crown-4,1-aza-15-crown-5,1-aza-18-crown-6,
tris(2-formyloxyethyl)amine, tris(2-acetoxyethyl)amine,
tris(2-propionyloxyethyl)amine, tris(2-butyryloxyethyl)amine,
tris(2-isobutyryloxyethyl)amine, tris(2-valeryloxyethyl)amine,
tris(2-pivaloyloxyethyl)amine,
N,N-bis(2-acetoxyethyl)-2-(acetoxyacetoxy)ethylamine,
tris(2-methoxycarbonyloxyethyl)amine,
tris(2-tert-butoxycarbonyloxyethyl)amine,
tris[2-(2-oxopropoxy)ethyl]amine,
tris[2-(methoxycarbonylmethyl)oxyethyl]amine,
tris[2-(tert-butoxycarbonylmethyloxy)ethyl]amine,
tris[2-(cyclohexyloxycarbonylmethyloxy)ethyl]amine,
tris(2-methoxycarbonylethyl)amine,
tris(2-ethoxycarbonylethyl)amine,
N,N-bis(2-hydroxyethyl)-2-(methoxycarbonylethyl)amine,
N,N-bis(2-acetoxyethyl)-2-(methoxycarbonyl)ethylamine,
N,N-bis(2-hydroxyethyl)-2-(ethoxycarbonyl)ethylamine,
N,N-bis(2-acetoxyethyl)-2-(ethoxycarbonyl)ethylamine,
N,N-bis(2-hydroxyethyl)-2-(2-methoxyethoxycarbonyl)ethylamine,
N,N-bis(2-acetoxyethyl)-2-(2-methoxyethoxycarbonyl)ethylamine,
N,N-bis(2-hydroxyethyl)-2-(2-hydroxyethoxycarbonyl)ethylamine,
N,N-bis(2-acetoxyethyl)-2-(2-acetoxyethoxycarbonyl)ethylamine,
N,N-bis(2-hydroxyethyl)-2-[(methoxycarbonyl)methoxycarbonyl]-ethylamine,
N,N-bis(2-acetoxyethyl)-2-[(methoxycarbonyl)methoxycarbonyl]-ethylamine,
N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)-ethylamine,
N,N-bis(2-acetoxyethyl)-2-(tetrahydrofurfuryloxycarbonyl)-ethylamine,
N,N-bis(2-hydroxyethyl)-2-[(2-oxotetrahydrofuran-3-yl)oxy-carbonyl]ethylamine,
N,N-bis(2-acetoxyethyl)-2-[(2-oxotetrahydrofuran-3-yl)oxy-carbonyl]ethylamine,
N,N-bis(2-hydroxyethyl)-2-(4-hydroxybutoxycarbonyl)ethylamine,
N,N-bis(2-formyloxyethyl)-2-(4-formyloxybutoxycarbonyl)-ethylamine,
N,N-bis(2-formyloxyethyl)-2-(2-formyloxyethoxycarbonyl)-ethylamine,
N,N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl]amine,
N-(3-acetoxy-1-propyl)-bis[2-(methoxycarbonyl)ethyl]amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbonyl)ethyl]amine,
N-methyl-bis(2-acetoxyethyl)amine,
N-ethylbis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(tert-butoxycarbonyloxy)ethyl]amine,
tris(methoxycarbonylmethyl)amine,
tris(ethoxycarbonylmethyl)amine,
N-butyl-bis(methoxycarbonylmethyl)amine,
N-hexyl-bis(methoxycarbonylmethyl)amine, and
β-(diethylamino)-δ-valerolactone.

These basic compounds may be used singly or in combination of two or more.

The amount of the basic compound is in the range of 0 to 3 parts by weight, preferably 0.01 to 1 part by weight, per 100 parts by weight of the silicone skeleton-containing polymer compound in view of the sensitivity.

Aside from the ingredients set out hereinabove, additive ingredients may be formulated in the photocurable resin composition used for forming a photocurable resin layer of the photocurable dry film of the invention. The additive ingredients include, for example, surface active agents ordinarily employed for improving coating properties and light absorbers ordinarily employed for improving a light absorption efficiency of photoacid generator.

The surface active agent is preferably a nonionic one, e.g. a fluorine-based surface active agent. Specific examples include perfluoroalkylpolyoxyethylene ethanol, fluorinated alkyl esters, perfluoroalkylamine oxides, fluorine-containing organosiloxane compounds and the like.

Commercially available ones may be used for this purpose and include, for example, Fluorad "FC-4430" (made by Sumitomo 3M Limited), Surflon "S-141" and "S-145" (both, made by Asahi Glass Co., Ltd.), Yunidyne "DS-401," "DS-4031" and "DS-451" (all, made by Daikin Industries, Ltd.), Megafac "F-8151" (made by DIC Corporation), "X-70-093" (made by Shin-Etsu Chemical Co., Ltd.) and the like. Of these, Fluorad "FC-4430" (made by Sumitomo 3M Limited) and "X-70-093" (made by Shin-Etsu Chemical Co., Ltd.) are preferred.

The light absorber includes, for example, a diarylsulfoxide, a diarylsulfone, 9,10-dimethylanthracene, 9-fluorenone or the like.

In the photocurable dry film of the invention, the photocurable resin composition for forming the photocurable resin layer can be prepared according to an ordinary procedure. Where the photocurable resin layer is made of a photocurable silicone composition, the ingredients set out hereinbefore are mixed under agitation and filtered such as through a filter to prepare the photocurable resin composition.

The support film used in the photocurable dry film of the invention may be made of a single film or a multilayered film obtained by laminating plural polymer films. To this end, films of synthetic resins such as polyethylene, polypropylene, polycarbonates, polyethylene terephthalate and the like are usable, of which polyethylene terephthalate is preferred because of its an appropriate degree of flexibility, good mechanical strength and heat resistance. These films may be ones that are subjected to treatments such as a corona treatment or a coating treatment with a release agent. Commercial products may be used for this purpose and include, for example, Cerapeel WZ (RX) and BX8 (R) (both, made by Toray Advanced Film Co., Ltd.), E7302 and E7304 (both, made by Toyobo Co., Ltd.), Purex G31 and Purex G71T1 (both made by Teijin DuPont Films Japan Limited), PET38×1-A3, PET38×1-V8 and PET38×1-X08 (all made by Nippa Co., Ltd.) and the like.

Although the protective film used in the photocurable dry film of the invention may be one used as the above-described support film, it is preferred to use polyethylene terephthalate and polyethylene films having an appropriate degree of flexibility. Commercially available products may be used for this purpose and include those films indicated above for polyethylene terephthalate. For a polyethylene film, mention is made, for example, of GF-8 (Tamapoly Co., Ltd.) and PE film 0 type (made by Nippa Co., Ltd.).

The thicknesses of the support film and protective film are both preferably at 10 to 100 μm, more preferably at 25 to 50 μm from the standpoint of the manufacturing stability for photocurable dry film and the prevention of core-set curl or so-called curl prevention.

The method for manufacturing the photocurable dry film of the invention is now described.

For a manufacturing apparatus of the photocurable dry film, film coaters ordinarily used to manufacture adhesive products can be employed. Such film coaters include, for example, a comma coater, a comma reverse coater, a multi-coater, a die coater, a lip coater, a lip reverse coater, a direct gravure coater, an offset gravure coater, a bottom feed 3-roll reverse coater, a bottom feed 4-roll reverse coater and the like.

The support film is wound off from a let-off shaft of a film coater. When the film passes a coater head of the film coater, a photocurable resin composition is coated onto a support film in a given thickness, followed by passing through a hot air circulation oven at a given temperature for a given time. The resulting photocurable resin layer dried on the support film is passed through laminate rolls at a given compression pressure along with a protective film wound off from another let-off shaft of the film coater to laminate with the photocurable resin layer on the support film. Thereafter, the laminate film is wound about a winding ribbon of the film coater. In this case, the above-indicated temperature is preferably at 25 to 150° C., the above-indicated time is preferably at 1 to 100 minutes, and the compression pressure is preferably at 0.01 to 5 MPa.

Further, patterning of the photocurable dry film in the practice of the invention is illustrated.

The protective film is peeled off from the photocurable dry film of the invention and the photocurable resin layer is brought in intimate contact with a substrate, followed by exposure to light, thermal treatment after the exposure (i.e. post exposure baking (hereinafter referred to PEB)), development and, if necessary, after-curing to form a pattern thereby obtaining a final film for protecting of electric and electronic parts.

Initially, the photocurable dry film is intimately contacted with a substrate by use of a film laminating apparatus. The substrates include, for example, silicon wafers, silicon wafers for TSV, circuit boards of plastics, ceramics and a variety of metals or the like. Especially, mention is made of substrates having a trench or hole that has an aperture width of 10 to 100 μm and a depth of 10 to 120 μm. The film laminating apparatus preferably includes a vacuum laminator. The photocurable dry film is attached to the film laminating apparatus and the protective film is peeled off from the photocurable dry film to expose the photocurable resin layer. This layer is brought in intimate contact with a substrate on a table at a given temperature by use of laminating rolls at a given compression pressure within a vacuum chamber set at a given degree of vacuum. It will be noted that the given temperature is preferably at 60 to 120° C., the given pressure is preferably at 0 to 5.0 MPa, and the degree of vacuum is preferably at 50 to 500 Pa. After the intimate contact, patterning is carried out by use of a known lithographic technique. In order to efficiently perform a photocuring reaction of the photocurable resin layer or to improve the contact between the photocurable resin layer and the substrate, a pre-heating (or pre-baking) may be performed, if necessary. The pre-baking may be carried out, for example, at 40 to 140° C. for about one minute to one hour. Next, the photocurable resin layer is cured by exposure to light having a wavelength of 190 to 500 nm via a photomask through the support film or in a state of the support film being peeled off. The photomask may be, for example, one wherein a desired pattern is cut out. It will be noted that the material for the photomask should preferably serve as a shield against light having such a wavelength as of 190 to 500 nm and, for example, chromium is conveniently used for this although not limitative. Light having a wavelength of 190 to 500 nm includes light rays having various wavelengths generated, for example, from radiation generators, e.g. UV rays such as a g-ray, an i-ray and the like, and far-ultraviolet rays (248 nm, 193 nm). A preferred wavelength ranges from 248 to 436 nm. The light exposure is preferably at 10 to 3,000 mJ/cm$^2$, for example. Such an exposure enables an exposed area to be crosslinked thereby forming an insolubilized pattern insoluble in the solvent used as a liquid developer.

In order to enhance developing sensitivity, post exposure baking (PEB) is carried out. The baking conditions after the exposure include, for example, a temperature of 40 to 140° C. and a time of 0.5 to 10 minutes.

Thereafter, development with a liquid developer is performed. The liquid developer may be a solvent of the photocurable resin composition used to form the photocurable resin layer of the photocurable dry film of the invention. Preferred examples of the solvent include alcohols such as isopropyl alcohol (IPA) and the like, ketones such as cyclohexanone and the like, and glycols such as propylene glycol monomethyl ether and the like. The development can be carried out by an ordinary method, e.g. by immersing the pattern-formed substrate in the liquid developer. Thereafter, washing, rinsing, drying and like are carried out, if necessary, to obtain a cured film of the photocurable resin layer having a desired pattern. It is to be noted that if no patterning is required or if a merely uniform film is formed, for example, a procedure as set out with respect to the above patterning method is repeated except that the photomask is not used.

The resulting pattern is after-cured by use of an oven or a hot plate at a temperature of 100 to 250° C., preferably at 150 to 220° C. and more preferably at 170 to 190° C. The after-curing temperature of 100 to 250° C. is favored from the standpoint of the adhesion to substrate, heat resistance, strength and electric characteristics based on the fact that the cured film of the photocurable resin composition is increased in crosslinking density and the volatile component left can be removed. The after-curing time can be set at 10 minutes to 10 hours.

The thus obtained cured film is excellent in flexibility, adhesion to substrate, heat resistance, electric characteristics, mechanical strength and chemical resistance to solder flux solution and is also excellent in reliability of semiconductor devices making use of the film as a protective film therefor. Additionally, the cured film is able to prevent crack occurrence in the course of a temperature cycle test and can be beneficially used as a film for protecting electric and electronic parts and semiconductor devices.

EXAMPLE

The invention is more particularly described by way of Synthetic Examples, Examples and Comparative Examples. The invention should not be construed as limited to these Examples. In the Examples, parts are by weight.

1. Preparation of Photocurable Resin Compositions

The chemical structural formulas of compounds M-1 to M-6 used in the following Synthetic Examples are indicated below.

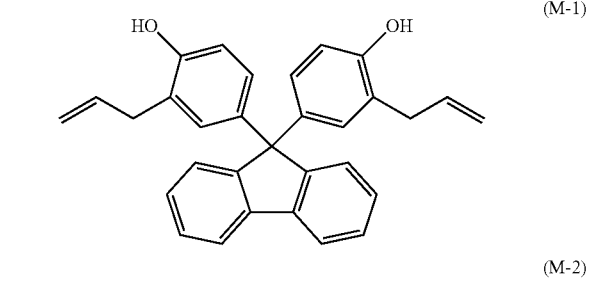

(M-1)

(M-2)

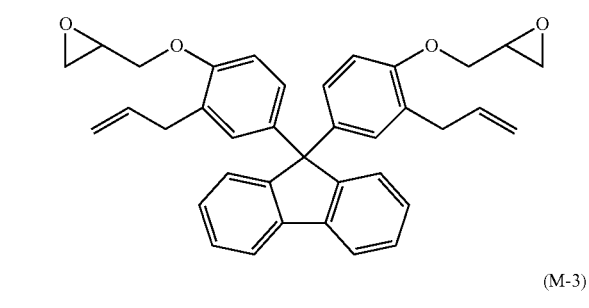

(M-3)

(M-4)

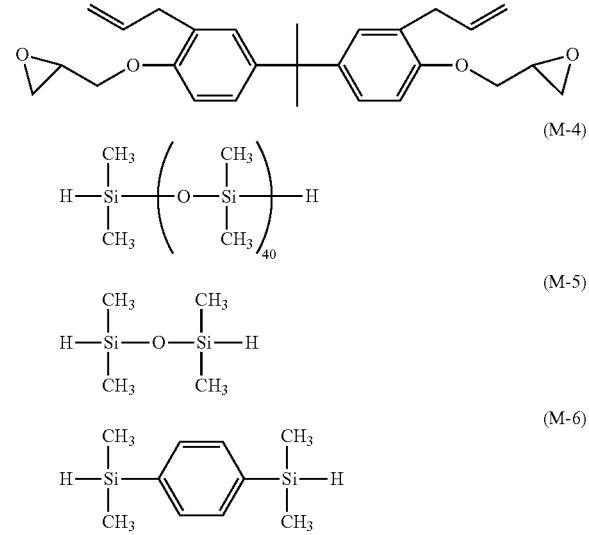

(M-5)

(M-6)

The structure of X and Y obtained by the following Synthetic Examples are also indicated below.

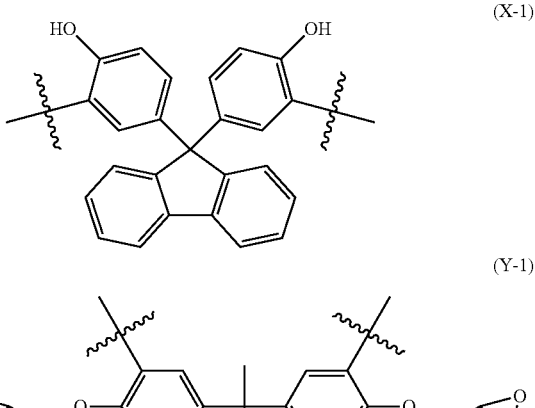

(X-1)

(Y-1)

(Y-2)

Synthetic Example 1

396.5 g of compound (M-1) was dissolved in 1,668 g of toluene in a 5 liter flask equipped with an agitator, a thermometer, a nitrogen purge device and a reflux condenser, followed by further addition of 859.2 g of compound (M-4) and heating to 60° C. Thereafter, 2.2 g of a platinum on carbon catalyst (5 wt %) was charged, and after confirmation of an internal reaction temperature raised to 65 to 67° C., the reaction solution was further heated to 90° C. for three hours and cooled down to 60° C., followed by charging 2.2 g of a platinum on carbon catalyst (5 wt %) and dropping 78.3 g of compound (M-5) in the flask in one hour. At this stage, the temperature in the flask was raised up to 79° C. After completion of the dropping, the reaction solution was aged at 90° C. for three hours and cooled down to room temperature, to which 1,550 g of methyl isobutyl ketone was added, followed by subjecting the reaction solution to pressure filtration with a filter to remove the platinum catalyst. Moreover, 700 g of pure water was added to the resulting silicone skeleton-containing polymer compound solution, followed by agitation, standing liquid separation and removal of a lower aqueous phase. The liquid separation and washing operations were repeated six times, thereby eliminating a very small amount of the acid component from the silicone skeleton-containing polymer compound solution. The solvent of the silicone skeleton-containing polymer compound solution was distilled off and removed under reduced pressure, to which 2,000 g of cyclopentanone was added so as to obtain silicone skeleton-containing polymer compound solution (A-1) having a solid concentration of 60, wt % and making use of the cyclopentanone as a main solvent. The molecular weight of the silicone skeleton-containing polymer compound in the silicone skeleton-containing polymer compound solution was measured by GPC, revealing that the weight average molecular weight in polystyrene conversion was at 42,000 and in the formula (1), a was at 0, b was at 1, c was at 0 and d was at 0. The structure of X in b was the structure (X-1) shown above.

Synthetic Example 2

352.8 g of compound (M-1) and 90.0 g of compound (M-3) were dissolved in 1,875 g of toluene in a 5 liter flask equipped with an agitator, a thermometer, a nitrogen purge device and a reflux condenser, followed by further addition of 949.6 g of compound (M-4) and 6.1 g of compound (M-5) and heating to 60° C. Thereafter, 2.2 g of a platinum on carbon catalyst (5 wt %) was charged, and after confirmation of an internal reaction temperature raised to 65 to 67° C., the reaction solution was further heated to 90° C. for three hours and cooled down to 60° C., followed by charging 2.2 g of a platinum on carbon catalyst (5 wt %) and dropping 107.3 g of compound (M-6) in the flask in one hour. At this stage, the temperature in the flask was raised up to 79° C. After completion of the dropping, the reaction solution was aged at 90° C. for three hours and cooled down to room temperature, to which 1,700 g of methyl isobutyl ketone was added, followed by subjecting the reaction solution to pressure filtration with a filter to remove the platinum catalyst. Moreover, 760 g of pure water was added to the resulting silicone skeleton-containing polymer compound solution, followed by agitation, standing liquid separation and removal of a lower aqueous phase. The liquid separation and washing operations were repeated six times, thereby eliminating a very small amount of the acid component from the silicone skeleton-containing polymer compound solution. The solvent of the silicone skeleton-containing polymer compound solution was removed by distillation under reduced pressure, to which 980 g of cyclopentanone was added so as to obtain silicone skeleton-containing polymer compound solution (A-2) having a solid concentration of 60 wt % and making use of the cyclopentanone as a main solvent. The molecular weight of the silicone skeleton-containing polymer compound in the silicone skeleton-containing polymer compound solution was measured by GPC, revealing that the weight average molecular weight in polystyrene conversion was at 64,000 and in the formula (1), a was at 0.480, b was at 0.320, c was at 0.120 and d was at 0.080. The structure of X in a and b was the structure (X-1) and the structure of Y in c and d was the structure (Y-1) shown above.

Synthetic Example 3

352.8 g of compound (M-1) and 116.1 g of compound (M-2) were dissolved in 1,875 g of toluene in a 5 liter flask equipped with an agitator, a thermometer, a nitrogen purge device and a reflux condenser, followed by further addition of 949.6 g of compound (M-4) and 6.1 g of compound (M-5) and heating to 60° C. Thereafter, 2.2 g of a platinum on carbon catalyst (5 wt %) was charged, and after confirmation of an internal reaction temperature raised to 65 to 67° C., the reaction solution was further heated to 90° C. for three hours and cooled down to 60° C., followed by charging 2.2 g of a platinum on carbon catalyst (5 wt %) and dropping 107.3 g of compound (M-6) in the flask in one hour. At this stage, the temperature in the flask was raised up to 73° C. After completion of the dropping, the reaction solution was aged at 90° C. for three hours and cooled down to room temperature, to which 1,700 g of methyl isobutyl ketone was added, followed by subjecting the reaction solution to pressure filtration with a filter to remove the platinum catalyst. Moreover, 760 g of pure water was added to the resulting silicone skeleton-containing polymer compound solution, followed by agitation, standing liquid separation and removal of a lower aqueous phase. The liquid separation and washing operations were repeated six times, thereby eliminating a very small amount of the acid component from the silicone skeleton-containing polymer compound solution. The solvent of the silicone skeleton-containing polymer compound solution was removed by distillation under reduced pressure to remove the solvent therefrom, to which 2,250 g of cyclopentanone was added so as to obtain silicone skeleton-containing polymer compound solution (A-3) having a solid concentration of 60 wt % and making use of the cyclopentanone as a main solvent. The molecular weight of the silicone skeleton-containing polymer compound in the silicone skeleton-containing polymer compound solution was measured by GPC, revealing that the weight average molecular weight in polystyrene conversion was at 55,000 and in the formula (1), a was at 0.486, b was at 0.314, c was at 0.114 and d was at 0.086. The structure of X in a and b was the structure (X-1) and the structure of Y in c and d was the structure (Y-2) shown above.

Synthetic Example 4

396.5 g of compound (M-1) was dissolved in 1,550 g of toluene in a 5 liter flask equipped with an agitator, a thermometer, a nitrogen purge device and a reflux condenser, followed by further addition of 859.2 g of compound (M-4) and heating to 60° C. Thereafter, 2.2 g of a platinum on carbon catalyst (5 wt %) was charged, and after confirmation of an internal reaction temperature raised to 65 to 67° C., the reaction solution was further heated to 90° C. for three hours and cooled down to 60° C., followed by charging 2.2 g of a platinum on carbon catalyst (5 wt %) and dropping 115.2 g of compound (M-6) in the flask in 1 hour. At this stage, the temperature in the flask was raised up to 78° C. After completion of the dropping, the reaction solution was aged at 90° C. for 10 hours and cooled down to room temperature, to which 1,700 g of methyl isobutyl ketone was added, followed by subjecting the reaction solution to pressure filtration with a filter to remove the platinum catalyst. Moreover, 700 g of pure water was added to the resulting silicone skeleton-containing polymer compound solution, followed by agitation, standing liquid separation and removal of a lower aqueous phase. The liquid separation and washing operations were repeated six times, thereby eliminating a very small amount of the acid component from the silicone skeleton-containing polymer compound solution. The solvent of the silicone skeleton-containing polymer compound solution was removed by distillation under reduced pressure, to which 832 g of cyclopentanone was added so as to obtain silicone skeleton-containing polymer compound solution (A-4) having a solid concentration of 60 wt % and making use of the cyclopentanone as a main solvent. The molecular weight of the silicone skeleton-containing polymer compound in the silicone skeleton-containing polymer compound solution was measured by GPC, revealing that the weight average molecular weight in polystyrene conversion was at 80,000 and in the formula (1), a was at 0.670, b was at 0.330, c was at 0 and d was at 0. The structure of X in a and b was the structure (X-1).

The solutions of the resins prepared in the Synthetic Examples 1 to 4 were used, in which crosslinking agents and photoacid generators were formulated to provide compositions indicated in Table 1, followed by agitation, mixing and dissolution, and microfiltration with a 0.2 μm Teflon (registered trade name) filter to obtain photocurable resin compositions.

TABLE 1

| | Ingredients of photocurable resin composition (parts by weight) | | |
|---|---|---|---|
| | Silicone skeleton-containing polymer compound | Photoacid generator | Crosslinking agent |
| Photocurable resin composition 1 | A-1 (100) | PAG-1 (1) | CL-1 (10) |
| Photocurable resin composition 2 | A-2 (100) | PAG-1 (1) | CL-1 (10) |
| Photocurable resin composition 3 | A-3 (100) | PAG-2 (1) | CL-1 (10) |
| Photocurable resin composition 4 | A-4 (100) | PAG-1 (1) | CL-2 (10) |

It will be noted that the respective photoacid generators indicated in Table 1 are shown below.

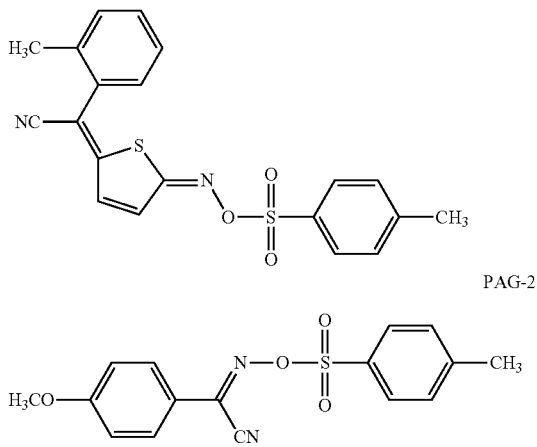

PAG-1

PAG-2

The crosslinking agents indicated in Table 1 are shown below.

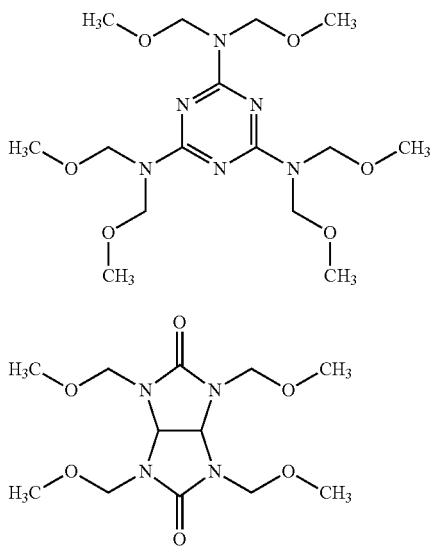

CL-1

CL-2

II. Preparation of Photocurable Dry Film

Using a die coater as a film coater and a polyethylene terephthalate film (thickness: 38 μm) as a support film, a photocurable resin composition 1 was coated onto the support films in three coating thicknesses, respectively. Next, the films were passed through a hot air circulation oven (with a length of 4 m) set at 100° C. in five minutes to form photocurable resin layers with three thicknesses on the respective support films. The respective photocurable resin layers had thicknesses of 10 μm (film No. 1-1), 25 μm (film No. 1-2) and 100 μm (film No. 1-3). Moreover, a polyethylene film (thickness: 50 μm) serving as a protective film was laminated on the respective photocurable resin layers by use of laminate rolls at a compression pressure of 1 MPa to provide photocurable dry films. It will be noted that with respect to the photocurable resin compositions 2 to 4, photocurable dry films were prepared in the same manner as with the case of the photocurable resin composition 1 in such a way that the respective photocurable resin layers had thicknesses of 10 μm (film Nos. 2-1, 3-1 and 4-1), 25 μm (film Nos. 2-2, 3-2 and 4-2) and 100 μm (film Nos. 2-3, 3-3 and 4-3). In short, 12 types of photocurable dry films in total were prepared.

III. Viscosity Coefficient

Using a rheometer (MARS II), made by German HAAKE GmbH, the coefficient was measured by sandwiching the photocurable resin layer between parallel plates so that its thickness was at 0.5 to 1.0 mm and adding a shear stress at a frequency of 1 Hz while raising the temperature. It will be noted that on the assumption that the behaviors of the photocurable resin layers having layer thicknesses of 0.5 to 1.0 mm and 10 to 100 μm relative to the temperature were similar to each other, the thickness of 0.5 to 1.0 mm was used for the measurement of viscosity coefficient for convenience's sake of measurement accuracy of MARS II. The measured values are shown in Table 2.

As shown in Table 2, the photocurable resin layers are good at fluidity.

TABLE 2

| Temperature (° C.) | Viscosity coefficient (Pa-second) Film No. | | | |
|---|---|---|---|---|
| | 1-2 | 2-2 | 3-2 | 4-2 |
| 80 | 160 | 503 | 402 | 2,280 |
| 90 | 67 | 220 | 176 | 760 |
| 100 | 32 | 109 | 87 | 280 |
| 110 | 19 | 53 | 42 | 121 |
| 120 | 15 | 29 | 23 | 59 |

IV. Embedding Performance

There were provided 6-inch silicon wafers each having 200 circular holes that had an aperture diameter of 10 to 100 μm (intervals of 10 μm) and a depth of 10 to 120 μm (intervals of 10 μm). Using the 12 types of photocurable dry films, the protective film was peeled off from the dry film and the photocurable resin layer on the support film was brought in intimate contact with the above substrate under temperature conditions indicated in Table 3 at a degree of vacuum of 100 Pa set in a vacuum chamber of a vacuum laminator (product name: TEAM-100RF), made by Takatori Corporation. After returning to a normal pressure, the substrate was cooled down to 25° C. and removed from the vacuum laminator, and the support film was separated therefrom.

Next, broad band light was irradiated over the substrate at light exposures (wavelength: 405 nm) indicated in Table 3 by use of a mask aligner (product name: MA-8), made by Suss Microtech AG. Thereafter, the substrate was subjected to post-exposure baking (PEB) at 130° C. for three minutes and cooled. Subsequently, the substrate was spray-developed with isopropyl alcohol (IPA) for five minutes, followed by after-curing at 180° C. for two hours by use of an oven while purging with nitrogen. The resulting substrate was diced to expose the section of the circular holes, followed by observation of the section of the circular holes by use of a scanning electron microscope (SEM) to evaluate the presence or absence of defects. The results are shown in Table 3.

As shown in Table 3, all the samples were free of defects and were filled and thus, the embedding performance for use as a film for protecting electric and electronic parts was good.

TABLE 3

| Film No. | Film thickness (μm) | Lamination temperature (° C.) | Light exposure (mJ/cm$^2$) | Results of observation of section of circular hole |
|---|---|---|---|---|
| 1-1 | 10 | 80 | 500 | No defect |
| 1-2 | 25 |    | 750 | No defect |
| 1-3 | 100 |   | 1,200 | No defect |
| 2-1 | 10 | 100 | 500 | No defect |
| 2-2 | 25 |    | 750 | No defect |
| 2-3 | 100 |   | 1,200 | No defect |
| 3-1 | 10 | 100 | 500 | No defect |
| 3-2 | 25 |    | 750 | No defect |
| 3-3 | 100 |   | 1,200 | No defect |
| 4-1 | 10 | 100 | 500 | No defect |
| 4-2 | 25 |    | 750 | No defect |
| 4-3 | 100 |   | 1,200 | No defect |
| 4-1 | 10 | 120 | 500 | No defect |
| 4-2 | 25 |    | 750 | No defect |
| 4-3 | 100 |   | 1,200 | No defect |

V. Electric Characteristic (Dielectric Breakdown Strength)

With respect to four types of photocurable dry films made above in a thickness of 25 μm, the protective film was peeled off and the photocurable resin layer on the support film was brought in intimate contact with the substrate defined in JIS K 6249 under temperature conditions of 100° C. The substrate was cooled down to room temperature, from which the support film was separated.

Next, broad band light was irradiated over the substrate through a quartz photomask at a light exposure of 750 mJ/cm$^2$ (wavelength: 405 nm) by use of such a mask aligner as used above. Thereafter, the substrate was subjected to PEB at 130° C. for three minutes and cooled, followed by spray development with IPA for five minutes. Subsequently, after-curing was carried out in an oven at 180° C. for two hours while purging with nitrogen to provide a substrate for measurement of dielectric breakdown strength. In accordance with the measuring method described in JIS K 6249, the dielectric breakdown strength was measured. The results are shown in Table 4.

As shown in Table 4, the electric characteristic for use as a film for protecting electric and electronic parts is good for all the samples.

VI. Adhesion

With respect to four types of photocurable dry films made above in a film thickness of 25 μm, the protective film was peeled off and the photocurable resin layer on the support film was brought in intimate contact with a non-treated 6-inch silicon wafer under temperature conditions of 100° C. while setting a degree of vacuum of 100 Pa in a vacuum chamber of the above-indicated vacuum laminator. After returning to a normal pressure, the substrate was cooled down to 25° C. and removed from the vacuum laminator, followed by separation of the support film.

Next, the substrate was irradiated with broad band light at a light exposure of 750 mJ/cm$^2$ (wavelength: 405 nm) through a quartz photomask by use of the above-indicated mask aligner. Thereafter, the substrate was subjected to PEB at 130° C. for three minutes and cooled, followed by spray development with IPA for five minutes. Subsequently, after-curing was carried out in an oven at 180° C. for two hours while purging with nitrogen to obtain a post-patterned cured film having a diameter of 300 μm and a height of 25 μm. The initial adhesion of the post-patterned cured film was evaluated by use of a bond tester (product name: Dage Series 4000-PXY) made by Dage Precision Industries Limited of UK in terms of a resistance force exerted on the peeling off of the post-patterned cured film from the substrate. The measuring conditions included a measuring speed of 50.0 μm/second and a measuring height of 3.0 μm.

FIG. 1 is an illustrative view showing a method of measuring the adhesion. In the FIGURE, indicated by 1 is a silicon (Si) substrate, by 2 is a post-patterned cured film, by 3 is a measuring tool of a bond tester, and by 4 is a direction of movement of the measuring tool. The numerical values obtained are each an average value of 15 measurements and a higher value results in better adhesion of the post-patterned cured film to the substrate.

Further, a solder flux solution was applied onto the post-patterned cured film on the substrate and heated at 220° C. for 30 seconds, followed by cooling, washing with pure water and drying at room temperature for two hours. The post-patterned cured film treated in this way was subjected to evaluation of adhesion after degradation by use of the bond tester in the same way as with the initial adhesion based on the resistance force exerted upon the peeling-off of the pattern from the substrate.

It will be noted that the adhesion of the four types of photocurable dry films is evaluated by comparing the values of the initial adhesion and the behaviors of the dry films wherein the numerical values of the initial adhesion lower after the degradation are compared with one another to evaluate a chemical resistance to the solder flux solution along with the adhesion. The results are shown in Table 4.

As shown in Table 4, adhesion for use as a film for protecting electric and electronic parts is good in all cases.

VII. Crack Resistance

Using four type of photocurable dry films prepared in a thickness of 25 μm, the protective film was peeled off from the film and the photocurable resin layer on the support film was brought in intimate contact with the substrate of a type used for the embedding characteristics under temperature conditions of 100° C. while setting a degree of vacuum at 100 Pa in a vacuum chamber of the above-indicated vacuum laminator. After returning to a normal pressure, the substrate was cooled down to 25° C. and removed from the vacuum laminator, followed by peeling off the support film.

Next, the substrate was irradiated with broad band light via a quartz photomask at a light exposure of 750 mJ/cm$^2$ (wavelength: 405 nm) by use of the above-indicated mask aligner. The substrate was subjected to PEB at 130° C. for three minutes and cooled. The substrate was spray-developed with IPS for five minutes, followed by after-curing in an oven at 180° C. for two hours while purging with nitrogen.

The substrate formed thereon with the cured film was placed in a temperature cycle tester wherein a cycle of −55 to +150° C. was set as a unit cycle and the presence or absence of crack occurrence in the cured film was checked up to 1,000 cycles. The results are shown in Table 4.

As shown in Table 4, crack resistance for use as a film for protecting electric and electronic parts is good.

VIII. Resistance to Liquid Remover

The four types of photocurable dry films made in a thickness of 25 μm were provided and the protective film was peeled off from the dry film. The photocurable resin layer on the support film was brought in intimate contact with a 6-inch silicon wafer under temperature conditions of 100° C. while setting a degree of vacuum at 100 Pa in a vacuum chamber of the vacuum laminator indicated before. After returning to a normal pressure, the substrate was cooled down to 25° C. and removed from the vacuum laminator, followed by peeling off the support film.

Next, using the mask aligner, the substrate was irradiated with broad band light via a quartz photomask at a light exposure of 750 mJ/cm$^2$ (wavelength: 405 nm). Subsequently, the substrate was subjected to PEB at 130° C. for three minutes and cooled. Thereafter, the substrate was spray developed with IPA for five minutes and after-cured in an oven at 180° C. for two hours while purging with nitrogen thereby obtaining a cured film of a 15 mm×15 mm square pattern.

This substrate was immersed in NMP at room temperature for one hour to check a variation in film thickness and an appearance thereby evaluating a resistance to liquid remover. The results are shown in Table 4.

As shown in Table 4, the resistance to liquid remover for use as a film for protecting electric and electronic parts is good for all the dry films.

TABLE 4

| Film No. | Electric characteristic Dielectric breakdown strength (V/μm) | Adhesion Initial (mN) | Adhesion After degradation (mN) | Crack resistance (after temperature cycle test) | Resistance to liquid remover (after immersion in NMP) |
|---|---|---|---|---|---|
| 1-2 | 400 | 320 | 220 | No crack | No change in appearance/thickness |
| 2-2 | 450 | 475 | 450 | No crack | No change in appearance/thickness |
| 3-2 | 400 | 440 | 410 | No crack | No change in appearance/thickness |
| 4-2 | 300 | 300 | 210 | No crack | No change in appearance/thickness |

Japanese Patent Application No. 2009-283670 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photocurable dry film comprising a structure having a 10 to 100 μm thick photocurable resin layer sandwiched between a support film and a protective film wherein the photocurable resin layer has a viscosity coefficient of 10 to 5,000 Pa·s at a temperature of 80 to 120° C., the photocurable resin layer being made of a photocurable resin composition comprising the following ingredients (A) to (D):

(A) a silicone skeleton-containing polymer compound having repeating units represented by the following general formula (1) and a weight average molecular weight of 3,000 to 500,000

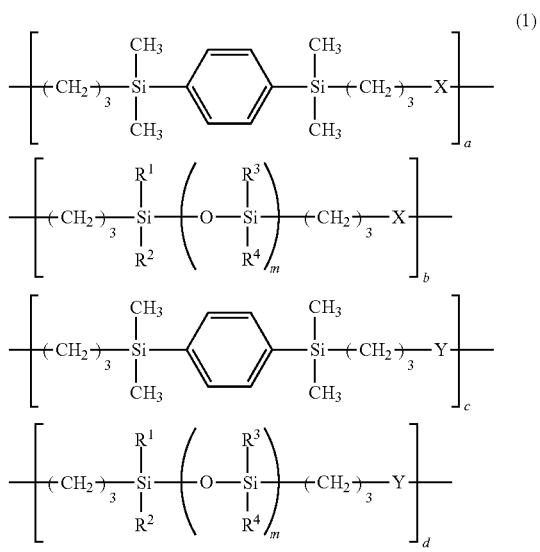

wherein $R^1$ to $R^4$ may be the same or different and represent a monovalent hydrocarbon group having 1 to 8 carbon atoms, m is an integer of 1 to 100, a, b, c and d are, respectively, 0 or a positive number provided that c and/or d is a positive number and a+b+c+d=1, X is a divalent organic group represented by the following general formula (2)

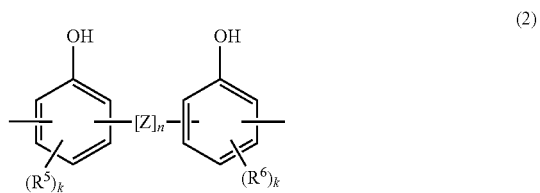

wherein Z represents a divalent organic group selected from the following groups

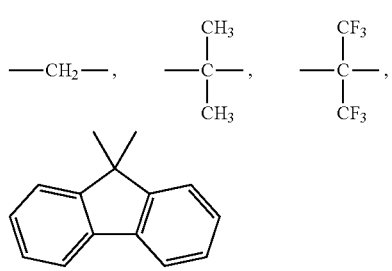

n is 0 or 1, $R^5$ and $R^6$ are, respectively, an alkyl group or alkoxy group having 1 to 4 carbon atoms and may be the same or different, and k is 0, 1 or 2, and Y is a divalent organic group represented by the following general formula (3)

(3)

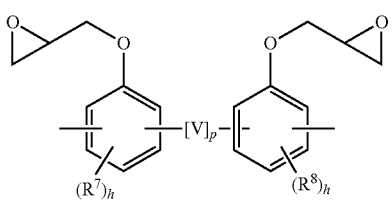

wherein V represents a divalent organic group selected from the following groups

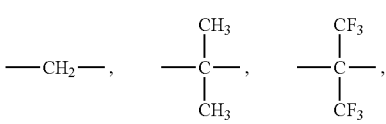

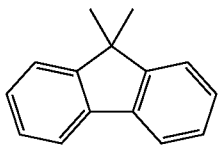

p is 0 or 1, $R^7$ and $R^8$, respectively, represent an alkyl group or alkoxy group having 1 to 4 carbon atoms and may be the same or different, and h is 0, 1 or 2;

(B) at least one crosslinking agent selected from formalin-modified or formalin-alcohol-modified amino condensates and phenolic compounds having, on average, two or more methylol groups or alkoxymethylol groups in one molecule;

(C) a photoacid generator capable of generating an acid by decomposition with light having a wavelength of 190 to 500 nm; and (D) a solvent.

2. The photocurable dry film as defined in claim 1, wherein in the formula (1), X is a divalent organic group represented by the general formula (2), and Y is a divalent organic group represented by the general formula (3).

3. The photocurable dry film as defined in claim 2, wherein in the formula (1), 0.3≤a≤0.7, 0.2≤b≤0.5, 0<c≤0.2, and 0<d≤0.2.

4. A laminate comprising a substrate having a trench and/or a hole with an aperture width of 10 to 100 μm and a depth of 10 to 120 μm and a cured layer of the photocurable resin composition of the photocurable dry film defined in claim 1 and laminated on said substrate.

5. A method for preparing a photocurable dry film defined in claim 1, which method comprising the steps of:

(i) continuously coating, onto a support film, a photocurable resin composition comprising the following ingredients (A) to (D)

(A) a silicone skeleton-containing polymer compound having repeating units represented by the following general formula (1) and a weight average molecular weight of 3,000 to 500,000

(1)

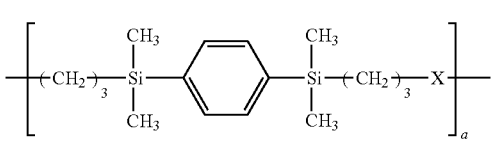

-continued

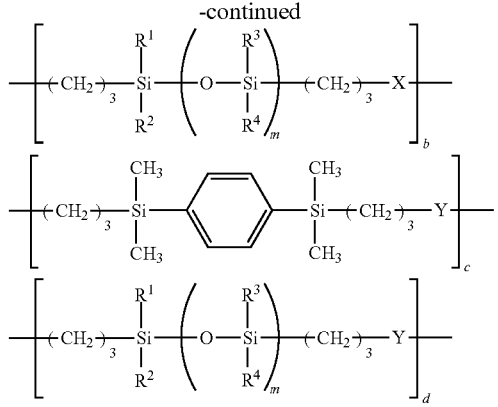

wherein $R^1$ to $R^4$ may be the same or different and represent a monovalent hydrocarbon group having 1 to 8 carbon atoms, m is an integer of 1 to 100, a, b, c and d are, respectively, 0 or a positive number provided that c and/or d is a positive number and a+b+c+d=1, X is a divalent organic group represented by the following general formula (2)

(2)

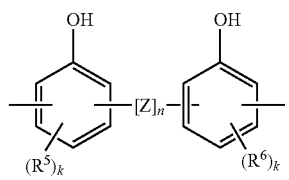

wherein Z represents a divalent organic group selected from the following groups

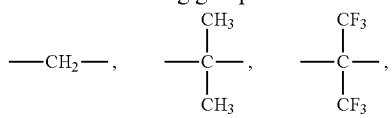

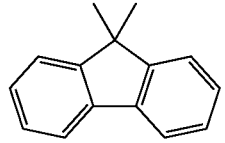

n is 0 or 1, $R^5$ and $R^6$ are, respectively, an alkyl group or alkoxy group having 1 to 4 carbon atoms and may be the same or different, and k is 0, 1 or 2, and Y is a divalent organic group represented by the following general formula (3)

(3)

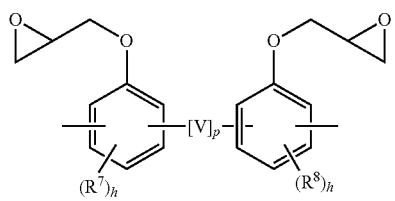

wherein V represents a divalent organic group selected from the following groups

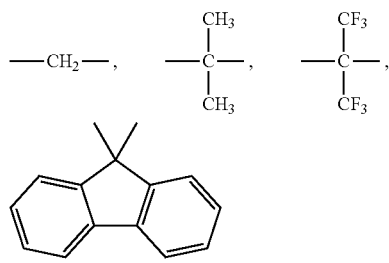

p is 0 or 1, $R^7$ and $R^8$, respectively, represent an alkyl group or alkoxy group having 1 to 4 carbon atoms and may be the same or different, and h is 0, 1 or 2;

(B) at least one crosslinking agent selected from formalin-modified or formalin-alcohol-modified amino condensates and phenolic compounds having, on average, two or more methylol groups or alkoxymethylol groups in one molecule, (C) a photoacid generator capable of generating an acid by decomposition with light having a wavelength of 190 to 500 nm, and (D) a solvent;

(ii) continuously drying said photocurable resin composition to form a photocurable resin layer on said support film; and (iii) placing a protective film over said photocurable resin layer.

6. The method for preparing a photocurable dry film as defined in claim 5, wherein in the formula (1), X is a divalent organic group represented by the general formula (2), and Y is a divalent organic group represented by the general formula (3).

7. A patterning method comprising the steps of:

(i) separating the protective film from the photocurable dry film defined in claim 1 and bringing an exposed photocurable resin layer in intimate contact with a substrate;

(ii) exposing said photocurable resin layer to light having a wavelength of 190 to 500 nm via photomask either through the support film or in a peeled-off state of the support film;

(iii) subjecting to heat treatment after the exposure; and (iv) developing with a liquid developer.

8. The patterning method as defined in claim 7, further comprising the step of (v) after-curing the film patterned by the development at a temperature of 100 to 250° C.

9. The patterning method as defined in claim 7, wherein said substrate has a trench and/or a hole having an aperture width of 10 to 100 μm and a depth of 10 to 120 μm.

10. A film for protecting electric or electronic parts composed of a cured film obtained by the patterning method defined in claim 7.

11. The photocurable dry film of claim 1 wherein in the formula (1), 0≤c≤0.2.

12. The photocurable dry film of claim 1 wherein in the formula (1), 0<d<0.2.

13. The photocurable dry film as defined in claim 2, wherein in formula (1), X is a divalent organic group of the formula (X-1)

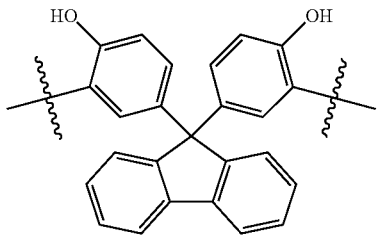

and Y is a divalent organic group of the formula (Y-1)

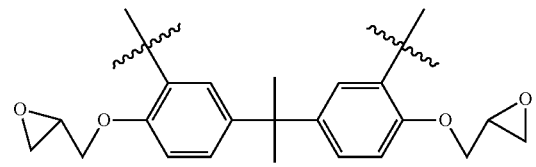

and a is 0.480, b is 0.320, c is 0.120, and d is 0.080.

14. The photocurable dry film as defined in claim 2, wherein in formula (1), X is a divalent organic group of the formula (X-1)

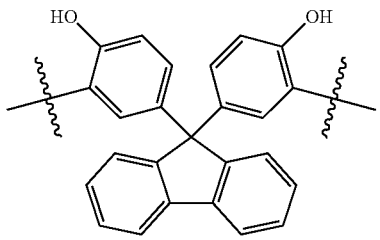

and Y is a divalent organic group of the formula (Y-2)

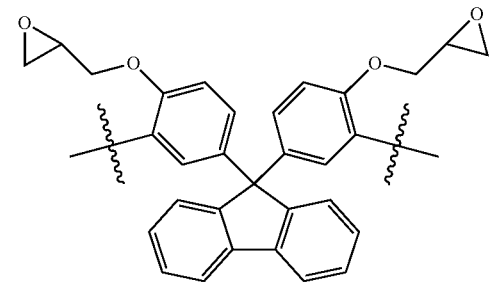

and a is 0.486, b is 0.314, c is 0.114, and d is 0.086.

15. The photocurable dry film as defined in claim 1, wherein the weight average molecular weight of the crosslinking agent (B) is 200 to 3000 and the amount of the crosslinking agent is from 1 to 30 parts by weight per 100 parts by weight of silicone skeleton-containing polymer (A).

16. The photocurable dry film as defined in claim 1, wherein photoacid generator component (C) comprises 0.2 to 5 parts by weight, per 100 parts by weight of silicone skeleton-containing polymer (A), of an imidoyl sulfonate, iminosulfonate, or oxime sulfonate.

17. The photocurable dry film as defined in claim 1, wherein solvent component (D) comprises 100 to 1000 parts by weight, per 100 parts by weight of the total of silicone skeleton-containing polymer (A), crosslinking agent (B), and photoacid generator (C), of ethyl lactate, cyclohexanone, cyclopentanone, propylene glycol monomethylether acetate, γ-butyrolactone, or a mixture thereof.

* * * * *